(12) United States Patent
Mao et al.

(10) Patent No.: US 9,826,658 B1
(45) Date of Patent: Nov. 21, 2017

(54) ELECTRONIC DEVICE AND TRAY

(71) Applicant: Wistron Corporation, New Taipei (TW)

(72) Inventors: Zhong-Hui Mao, New Taipei (TW); Kuan-Hsun Lu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/358,142

(22) Filed: Nov. 22, 2016

(30) Foreign Application Priority Data

Aug. 30, 2016 (CN) .......................... 2016 1 0772119

(51) Int. Cl.
*H05K 7/14* (2006.01)
*H05K 5/02* (2006.01)

(52) U.S. Cl.
CPC .......... *H05K 7/1489* (2013.01); *H05K 5/023* (2013.01); *H05K 5/0204* (2013.01); *H05K 7/1401* (2013.01); *H05K 7/1418* (2013.01); *H05K 7/1487* (2013.01)

(58) Field of Classification Search
None
See application file for complete search history.

(56) References Cited

U.S. PATENT DOCUMENTS

| | | | | |
|---|---|---|---|---|
| 5,481,431 A * | 1/1996 | Siahpolo | ................. | G06F 1/184 361/679.31 |
| 5,641,296 A * | 6/1997 | Larabell | ................. | G06F 1/184 439/157 |
| 7,126,817 B2 * | 10/2006 | Li | ........................... | G06F 1/184 312/223.2 |
| 7,400,936 B2 * | 7/2008 | Chang | .................... | G06F 1/184 361/679.33 |
| 7,771,218 B2 * | 8/2010 | Jaramillo | ............. | H05K 7/1492 439/157 |
| 8,089,770 B2 * | 1/2012 | Olesiewicz | ............. | G06F 1/185 361/752 |
| 8,116,082 B2 * | 2/2012 | Beaudoin | ........... | H05K 7/20581 211/41.17 |
| 8,169,783 B2 * | 5/2012 | Phillips | .............. | H01R 13/6275 361/728 |
| 8,405,966 B2 * | 3/2013 | Hartman | ................. | G06F 1/186 361/679.31 |

(Continued)

FOREIGN PATENT DOCUMENTS

| | | |
|---|---|---|
| CN | 2542418 | 4/2003 |
| TW | 272637 | 3/1996 |

*Primary Examiner* — Xanthia C Cunningham
(74) *Attorney, Agent, or Firm* — Winston Hsu

(57) ABSTRACT

A tray includes a tray body, a handle, a first gear, a second gear, a linking member and a block member. The first gear is fixed on the handle and pivotally connected to the tray body. The second gear is pivotally connected to the tray body and has an engaging portion. The linking member is connected to the first gear and the second gear. The block member is fixed on the tray body and has a resilient portion. When the handle rotates with respect to the tray body to a predetermined angle in an open direction, the resilient portion is engaged with the engaging portion, so as to restrain the handle from rotating in a close direction. When the resilient portion is disengaged from the engaging portion, the handle is capable of being operated to rotate with respect to the tray body in the close direction.

20 Claims, 26 Drawing Sheets

(56) References Cited

U.S. PATENT DOCUMENTS

| | | | | |
|---|---|---|---|---|
| 9,030,819 B2* | 5/2015 | He | H05K 7/14 | 248/222.51 |
| 9,122,458 B2* | 9/2015 | Yu | G06F 1/185 | |
| 9,214,749 B2* | 12/2015 | Li | H01R 13/62944 | |
| 9,229,496 B2* | 1/2016 | Cravens | G06F 1/187 | |
| 9,230,606 B2* | 1/2016 | Ding | G11B 33/022 | |
| 9,373,914 B2* | 6/2016 | Li | G06F 1/185 | |
| 9,456,519 B2* | 9/2016 | Bailey | H05K 7/1488 | |
| 9,462,719 B2* | 10/2016 | Wu | H05K 7/1409 | |
| 9,674,978 B2* | 6/2017 | Wu | G06F 1/185 | |
| 9,706,677 B2* | 7/2017 | Cravens | H05K 7/1489 | |
| 9,717,158 B2* | 7/2017 | Della Fiora | H05K 7/1487 | |
| 2003/0117779 A1* | 6/2003 | Gough | H05K 7/1488 | 361/728 |
| 2006/0171110 A1* | 8/2006 | Li | G06F 1/184 | 361/679.37 |
| 2009/0225527 A1* | 9/2009 | Olesiewicz | H05K 7/20727 | 361/802 |
| 2011/0289521 A1* | 11/2011 | Chen | G11B 33/124 | 720/601 |
| 2012/0087084 A1* | 4/2012 | Nguyen | G06F 1/187 | 361/679.37 |
| 2012/0217856 A1* | 8/2012 | Chen | G06F 1/187 | 312/327 |
| 2012/0240704 A1* | 9/2012 | Li | H05K 7/1409 | 74/412 R |
| 2013/0070422 A1* | 3/2013 | Dunham | G06F 1/187 | 361/725 |
| 2013/0229766 A1* | 9/2013 | Williams | G06F 1/16 | 361/679.33 |
| 2014/0254086 A1* | 9/2014 | Li | H01R 13/62944 | 361/679.32 |
| 2015/0077920 A1* | 3/2015 | Zhu | H05K 7/1487 | 361/679.31 |
| 2017/0045921 A1* | 2/2017 | Norton | H05K 7/1487 | |
| 2017/0196107 A1* | 7/2017 | Chen | F16M 13/022 | |

* cited by examiner

ELECTRONIC DEVICE AND TRAY

BACKGROUND OF THE INVENTION

1. Field of the Invention

The invention relates to an electronic device and a tray and, more particularly, to a tray capable of rising and descending smoothly and an electronic device equipped with the tray.

2. Description of the Prior Art

So far a circuit board system of some electronic devices (e.g. server) consists of an upper circuit board and a lower circuit board electrically connected to each other. A user may install the lower circuit board only according to specific requirement or, alternatively, install the upper and lower circuit boards simultaneously. In general, the upper and lower circuit boards are connected to each other by corresponding connectors, so as to establish data and power transmitting path. The upper and lower circuit boards usually have a plurality of corresponding connectors and each connector has several pins. When assembling or disassembling the upper circuit board, the user has to apply much force, such that the circuit board or the electronic components thereon may be damaged incautiously. Furthermore, when assembling the upper and lower circuit boards, the corresponding connectors have to be aligned without slant. Moreover, it is very difficult to make the corresponding connectors of the upper and lower circuit boards to be aligned with a force-applied point. If the force-applied point is not aligned with the connectors, the upper circuit board may slant during assembling or disassembling process. That will be a big challenge for a designer.

SUMMARY OF THE INVENTION

The invention provides a tray capable of rising and descending smoothly and an electronic device equipped with the tray, so as to solve the aforesaid problems.

According to an embodiment of the invention, the electronic device comprises a casing and a tray. The casing comprises a support frame and the support frame has a first rack, a second rack and a rod member. The tray comprises a tray body, a handle, a first gear, a second gear, a linking member and a block member. The first gear is fixed on the handle and pivotally connected to the tray body. The second gear is pivotally connected to the tray body and the second gear has an engaging portion. The linking member is connected to the first gear and the second gear. The block member is fixed on the tray body and the block member has a resilient portion. When the handle rotates with respect to the tray body to a predetermined angle in an open direction, the resilient portion is engaged with the engaging portion, so as to restrain the handle from rotating with respect to the tray body in a close direction. The close direction is opposite to the open direction. When the handle is located at the predetermined angle with respect to the tray body and the tray is placed into the casing, the rod member moves the resilient portion, such that the resilient portion is disengaged from the engaging portion. When the resilient portion is disengaged from the engaging portion, the first gear contacts the first rack, the second gear contacts the second rack, and the handle is capable of being operated to rotate with respect to the tray body in the close direction.

In this embodiment, the electronic device further comprises a first circuit board and a second circuit board. The first circuit board is disposed in the casing and the first circuit board has a first connector. The second circuit board is disposed on the tray body and the second circuit board has a second connector. When the handle rotates with respect to the tray body to the predetermined angle, the first connector and the second connector are separated from each other. When the handle rotates with respect to the tray body and the handle is closed with respect to the tray body, the first connector and the second connector are connected to each other.

According to another embodiment of the invention, a tray comprises a tray body, a handle, a first gear, a second gear, a linking member and a block member. The first gear is fixed on the handle and pivotally connected to the tray body. The second gear is pivotally connected to the tray body and the second gear has an engaging portion. The linking member is connected to the first gear and the second gear, wherein the first gear drives the second gear to rotate through the linking member. The block member is fixed on the tray body and the block member has a resilient portion. When the handle rotates with respect to the tray body to a predetermined angle in an open direction, the resilient portion is engaged with the engaging portion, so as to restrain the handle from rotating with respect to the tray body in a close direction. The close direction is opposite to the open direction. when the resilient portion is disengaged from the engaging portion, the handle is capable of being operated to rotate with respect to the tray body in the close direction.

As mentioned in the above, the invention may dispose the first circuit board in the casing of the electronic device (e.g. server) and dispose the second circuit board on the tray body of the tray. When a user wants to connect the second circuit board with the first circuit board, the user can rotate the handle with respect to the tray body to the predetermined angle in the open direction, such that the resilient portion of the block member is engaged with the engaging portion of the second gear, so as to restrain the handle from rotating with respect to the tray body in the close direction. Afterward, the user can place the tray into the casing, such that the rod member of the support frame moves the resilient portion of the block member, so as to disengage the resilient portion of the block member from the engaging portion of the second gear. When the resilient portion of the block member is disengaged from the engaging portion of the second gear, the first gear contacts the first rack and the second gear contacts the second rack. Then, the user can operate the handle to rotate with respect to the tray body in the close direction, such that the first gear meshes with the first rack and rotates and the first gear drives the second gear to mesh with the second rack and rotate through the linking member. At this time, the tray body moves downwardly in a direction parallel to the first rack and the second rack. When the handle is closed with respect to the tray body, the first connector of the first circuit board and the second connector of the second circuit board are connected to each other, so as to establish data and power transmitting path.

When the user wants to detach the second circuit board from the first circuit board, the user can rotate the handle with respect to the tray body in the open direction, such that the first gear meshes with the first rack and rotates and the first gear drives the second gear to mesh with the second rack and rotate through the linking member. At this time, the tray body moves upwardly in a direction parallel to the first rack and the second rack, such that the first connector of the first circuit board and the second connector of the second circuit board are separated from each other. When the user rotates the handle with respect to the tray body to the predetermined angle in the open direction, the resilient portion of the block member is engaged with the engaging portion of the second gear, so as to restrain the handle from rotating with respect to the tray body in the close direction. At this time, the user can grasp the handle to remove the tray body with the second circuit board thereon from the casing of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
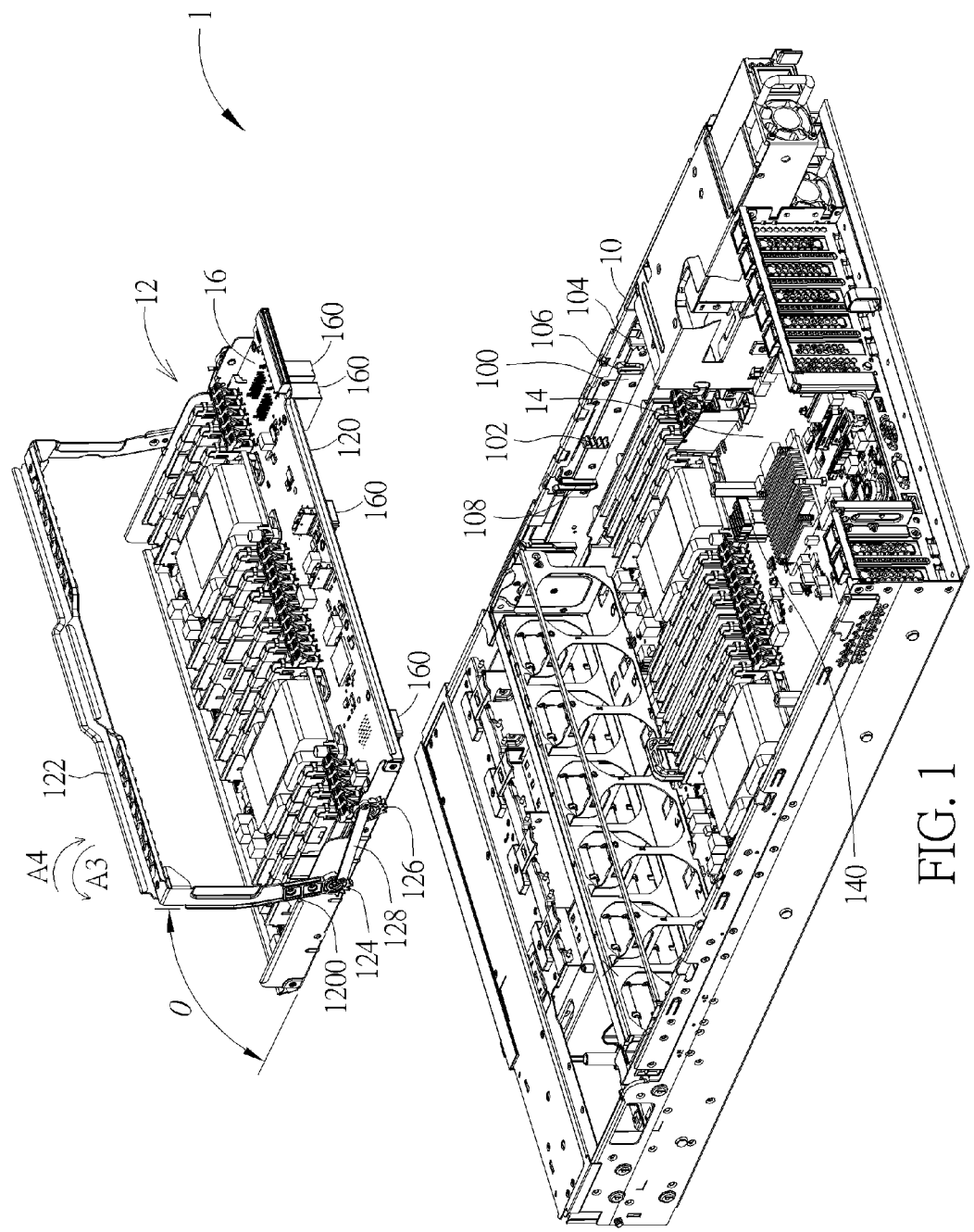
FIG. 1 is an exploded view illustrating an electronic device according to an embodiment of the invention.
Figure 2:
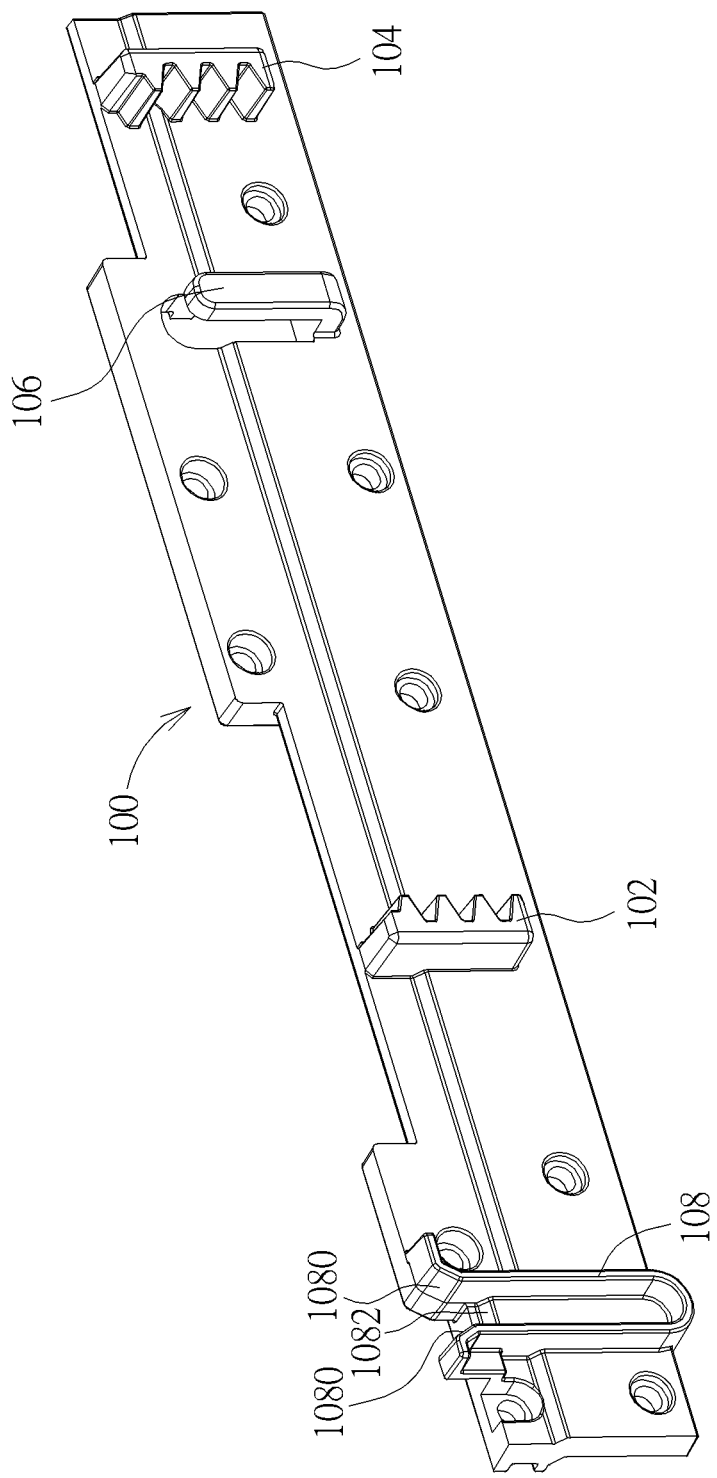
FIG. 2 is a perspective view illustrating the support frame shown in FIG. 1 from another viewing angle.
Figure 3:
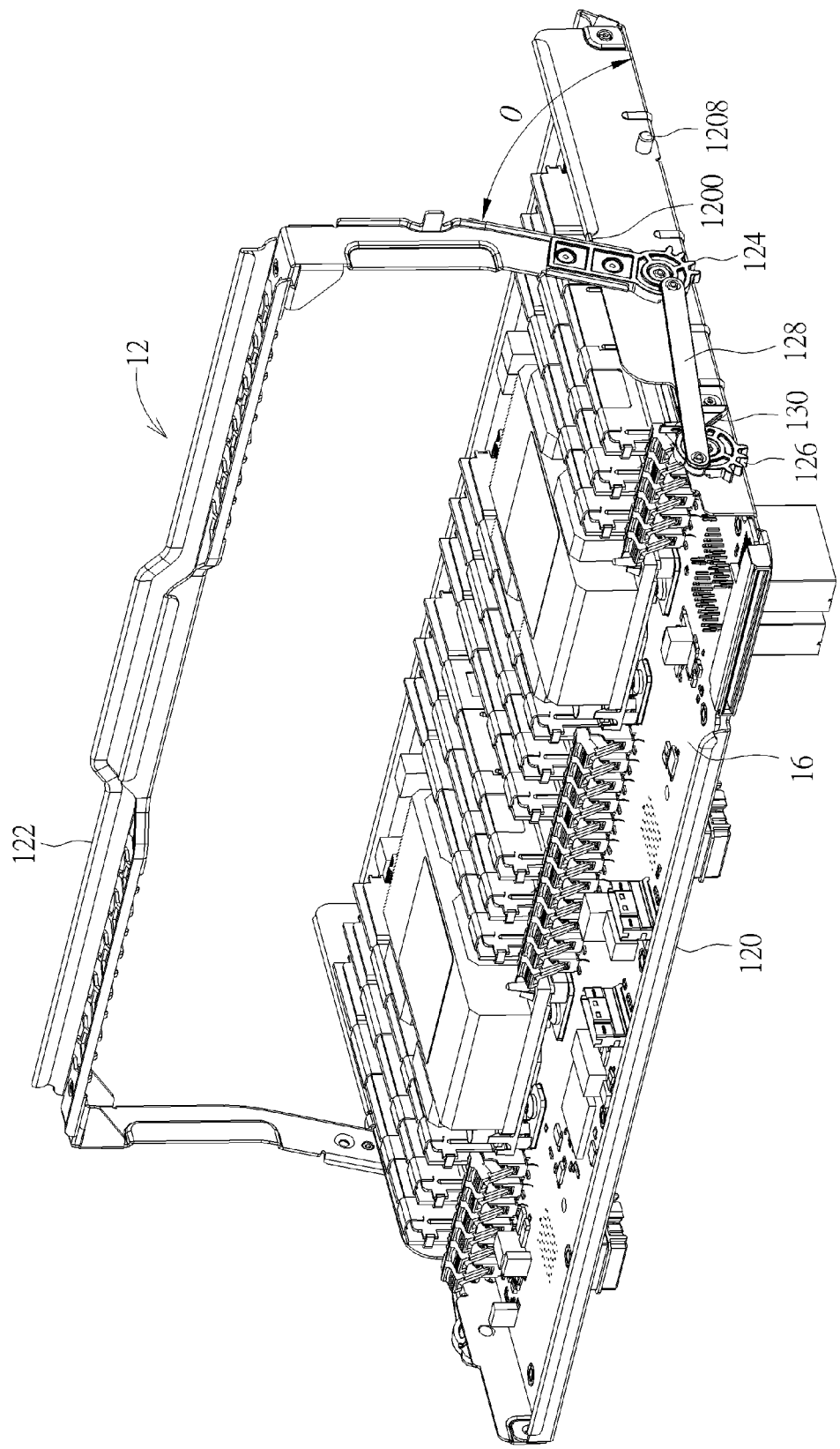
FIG. 3 is a perspective view illustrating the tray shown in FIG. 1 from another viewing angle.
Figure 4:
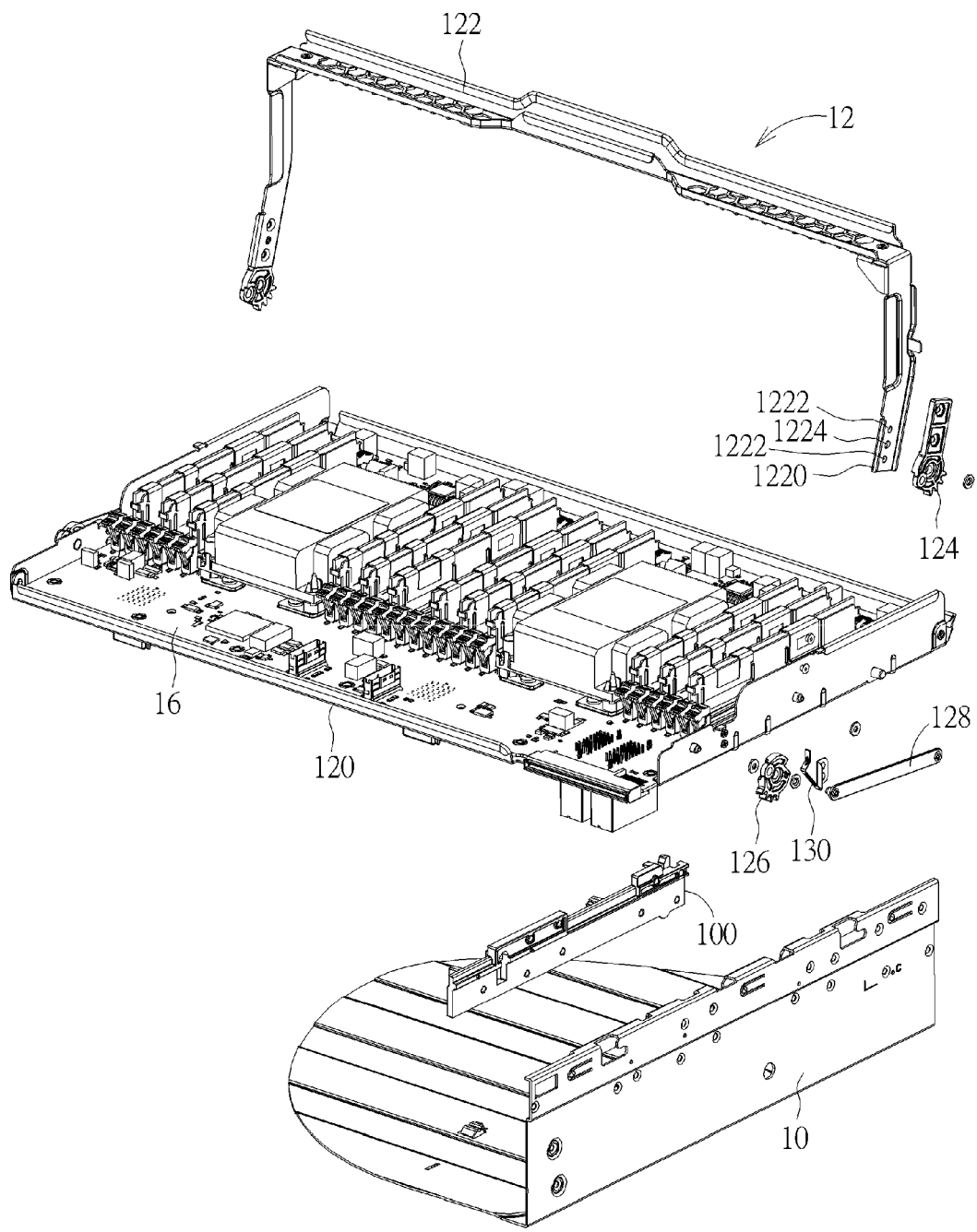
FIG. 4 is an exploded view illustrating the tray shown in FIG. 3.
Figure 5:
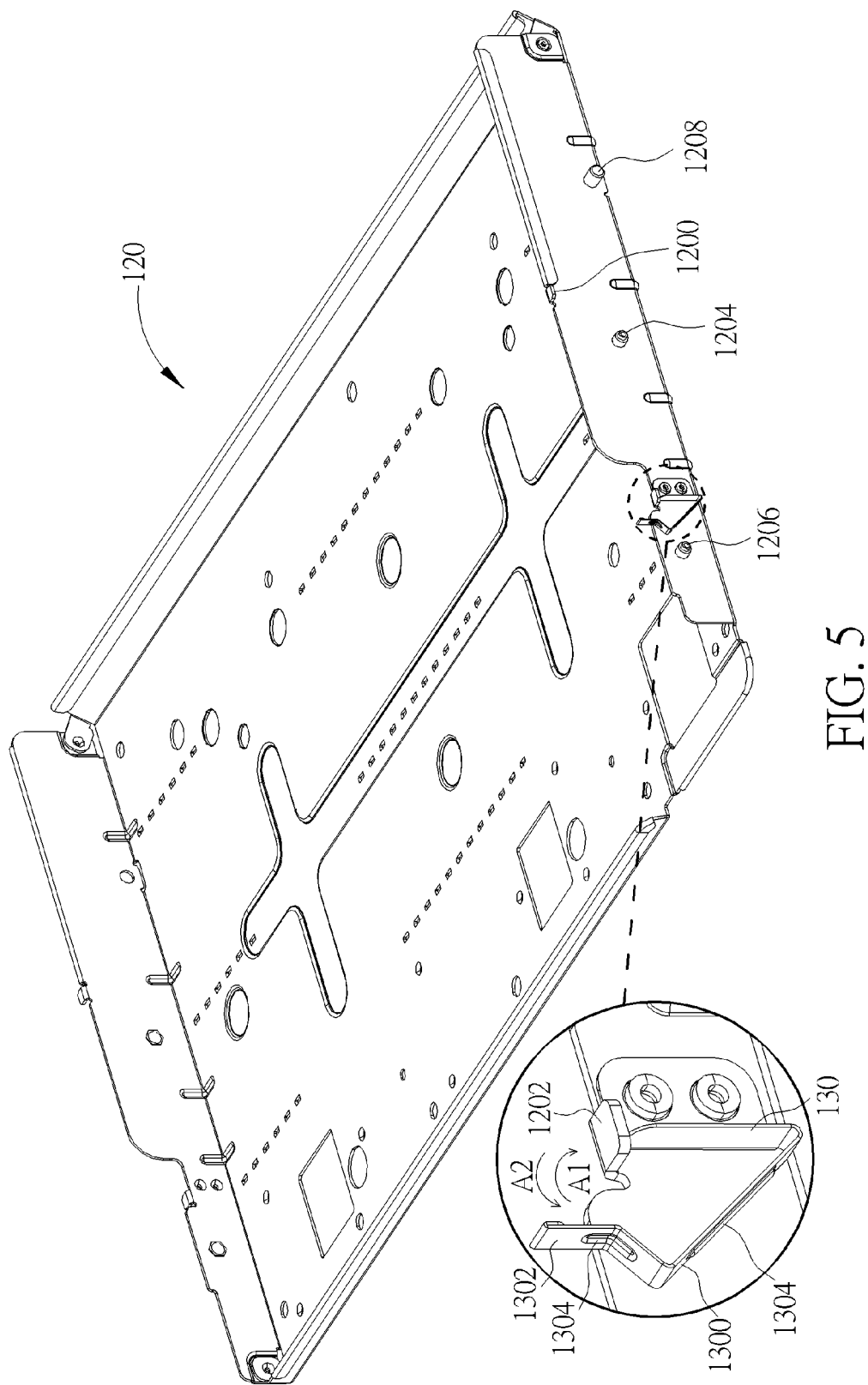
FIG. 5 is a perspective view illustrating the block member shown in FIG. 4 fixed on the tray body.
Figure 6:
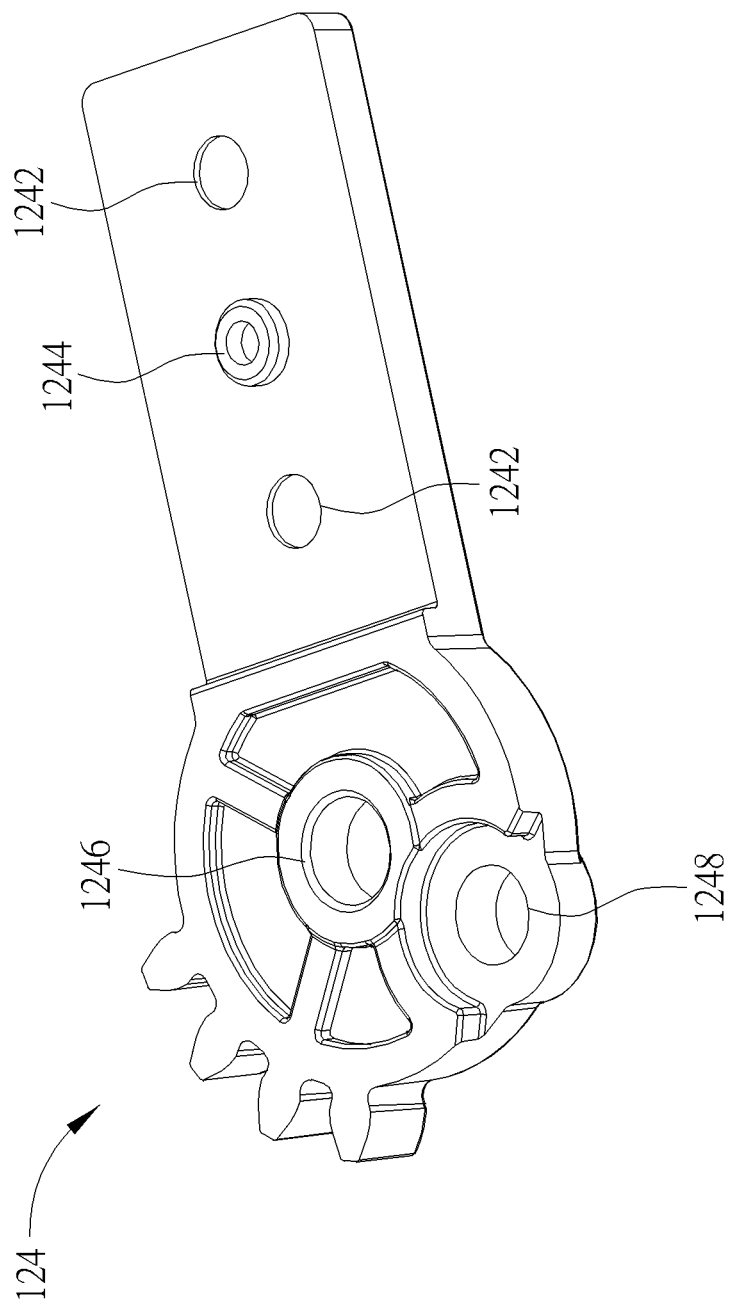
FIG. 6 is a perspective view illustrating the first gear shown in FIG. 4 from another viewing angle.
Figure 7:
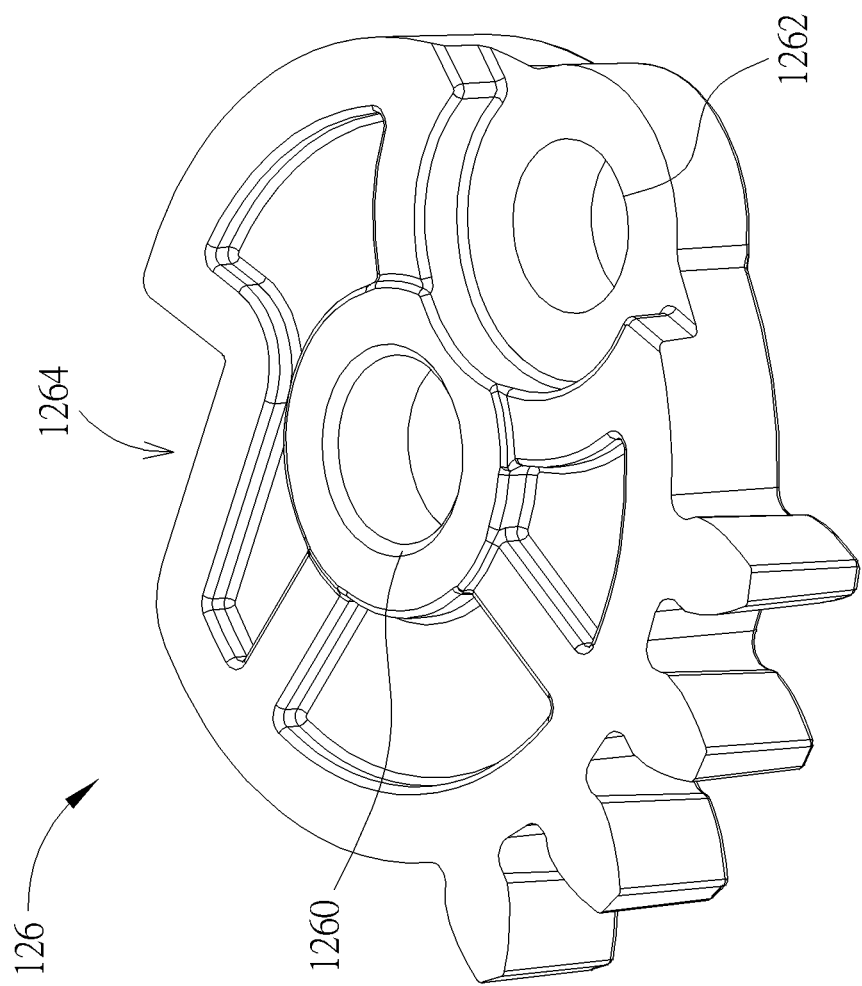
FIG. 7 is a perspective view illustrating the second gear shown in FIG. 4 from another viewing angle.
Figure 8:
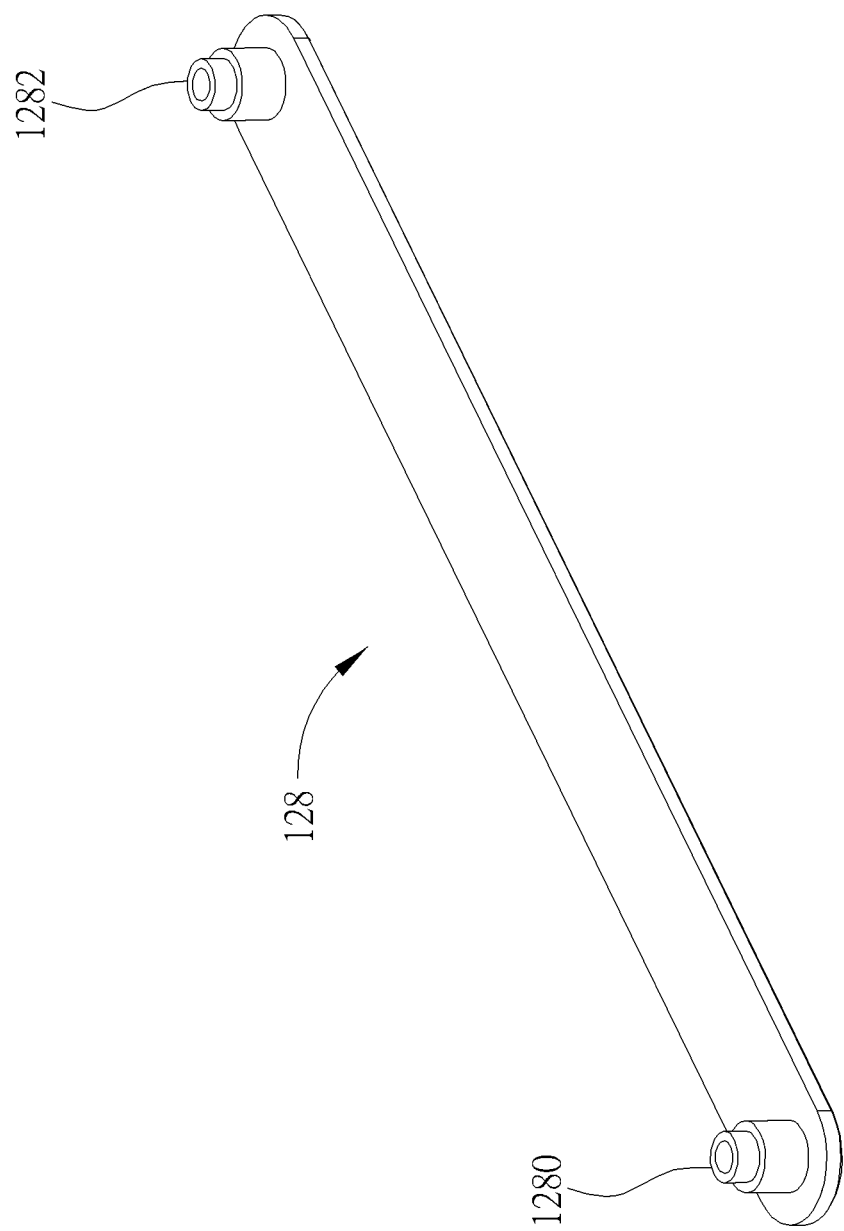
FIG. 8 is a perspective view illustrating the linking member shown in FIG. 4 from another viewing angle.

Referring to FIGS. 1 to 8, FIG. 1 is an exploded view illustrating an electronic device 1 according to an embodiment of the invention, FIG. 2 is a perspective view illustrating the support frame 100 shown in FIG. 1 from another viewing angle, FIG. 3 is a perspective view illustrating the tray 12 shown in FIG. 1 from another viewing angle, FIG. 4 is an exploded view illustrating the tray 12 shown in FIG. 3, FIG. 5 is a perspective view illustrating the block member 130 shown in FIG. 4 fixed on the tray body 120, FIG. 6 is a perspective view illustrating the first gear 124 shown in FIG. 4 from another viewing angle, FIG. 7 is a perspective view illustrating the second gear 126 shown in FIG. 4 from another viewing angle, and FIG. 8 is a perspective view illustrating the linking member 128 shown in FIG. 4 from another viewing angle.

As shown in FIG. 1, an electronic device 1 of the invention comprises a casing 10, a tray 12, a first circuit board 14 and a second circuit board 16. It should be noted that the casing 10 shown in FIG. 1 is only a part of a complete casing of the electronic device 1. In practical applications, the electronic device 1 may be a server or other electronic devices equipped with upper and lower circuit boards.

As shown in FIGS. 1 and 2, the casing 10 comprises a support frame 100 and the support frame 100 has a first rack 102, a second rack 104, a rod member 106 and a guiding groove 108. In this embodiment, the guiding groove 108 may have two end inclines 1080 and a bottom incline 1082, wherein the two end inclines 1080 are opposite to each other and the bottom incline 1082 is located between the two end inclines 1080. In practical applications, the support frame 100 may be made of plastic material through an injection molding process. Furthermore, the support frame 100 may be fixed on a side wall of the casing 10 in a riveting manner. It should be noted that FIG. 1 only shows the support frame 100 on one side wall of the casing 10, but the invention disposes the support frame 100 on opposite side walls of the casing 10.

As shown in FIGS. 3 and 4, the tray 12 comprises a tray body 120, a handle 122, a first gear 124, a second gear 126, a linking member 128 and a block member 130. The first gear 124 is fixed on the handle 122 and pivotally connected to the tray body 120. The second gear 126 is pivotally connected to the tray body 120. The linking member 128 is connected to the first gear 124 and the second gear 126. The block member 130 is fixed on the tray body 120.

In this embodiment, the tray body 120 may be made by punching a metal. As shown in FIG. 5, the tray body 120 has two block portions 1200, 1202, a first gear axle 1204, a second gear axle 1206 and a guiding pillar 1208. The block portions 1200, 1202 may be formed by bending a side wall of the tray body 120. The first gear axle 1204, the second gear axle 1206 and the guiding pillar 1208 may be fixed on a side wall of the casing 10 in a riveting manner. It should be noted that FIG. 5 only shows the block portions 1200, 1202, the first gear axle 1204, the second gear axle 1206 and the guiding pillar 1208 on one side wall of the tray body 120, but the invention disposes the block portions 1200, 1202, the first gear axle 1204, the second gear axle 1206 and the guiding pillar 1208 on opposite side walls of the tray body 120.

In this embodiment, the block member 130 may be made by punching a stainless steel sheet. As shown in FIG. 5, the block member 130 may be fixed on a side wall of the casing 10 in a riveting manner. The block member 130 may have a resilient portion 1300 and a press portion 1302, wherein the press portion 1302 extends from the resilient portion 1300. In practical applications, at least one reinforcing rib 1304 may be formed on the resilient portion 1300 and the press portion 1302, so as to enhance structural rigidity of the resilient portion 1300 and the press portion 1302. When the press portion 1302 is pressed in a direction indicated by an arrow A1, the press portion 1302 drives the resilient portion 1300 to deform elastically in the direction indicated by the arrow A1. When the press portion 1302 is released, the resilient portion 1300 recovers in a direction indicated by an arrow A2. The block portion 1202 of the tray body 120 can prevent the press portion 1302 from being overly pressed and then avoid elastic fatigue of the resilient portion 1300. It should be noted that FIG. 5 only shows the block member 130 on one side wall of the tray body 120, but the invention disposes the block member 130 on opposite side walls of the tray body 120.

In this embodiment, the first gear 124 may be made of plastic material through an injection molding process. As shown in FIG. 6, the first gear 124 has a fixing portion 1240 and the fixing portion 1240 has two fixing holes 1242 and a positioning pillar 1244 formed thereon. Furthermore, as shown in FIG. 4, an end portion 1220 of the handle 122 has two fixing holes 1222 and a positioning hole 1224 formed thereon. The invention may position the fixing portion 1240 of the first gear 124 on the end portion 1220 of the handle 122 by the cooperation between the positioning pillar 1244 and the positioning hole 1224 and then fix the fixing holes 1242 and the fixing holes 1222 in a riveting manner. Accordingly, the first gear 124 is fixed on the handle 122. Moreover, the first gear 124 further has two pivoting holes 1246, 1248. The first gear 124 may be pivotally connected to the first gear axle 1204 of the tray body 120 through the pivoting hole 1246.

In this embodiment, the second gear 126 may be made of plastic material through an injection molding process. As shown in FIG. 7, the second gear 126 has two pivoting holes 1260, 1262. The second gear 126 may be pivotally connected to the second gear axle 1206 of the tray body 120 through the pivoting hole 1260. Furthermore, the second gear 126 further has an engaging portion 1264.

In this embodiment, the linking member 128 may be a linking bar. As shown in FIG. 8, the linking member 128 has two pivoting axles 1280, 1282. The pivoting axle 1280 may be pivotally connected to the pivoting hole 1248 of the first gear 124 and the pivoting axle 1282 may be pivotally connected to the pivoting hole 1262 of the second gear 126, such that the linking member 128 is pivotally connected to the first gear 124 and the second gear 126. Accordingly, the linking member 128, the side wall of the tray body 120, the first gear 124 and the second gear 126 form a spatial four-bar mechanism. When the handle 122 rotates, the first gear 124 drives the second gear 126 to rotate through the linking member 128. In this embodiment, a rotating direction of the first gear 124 is opposite to a rotating direction of the second gear 126.

Figure 9:
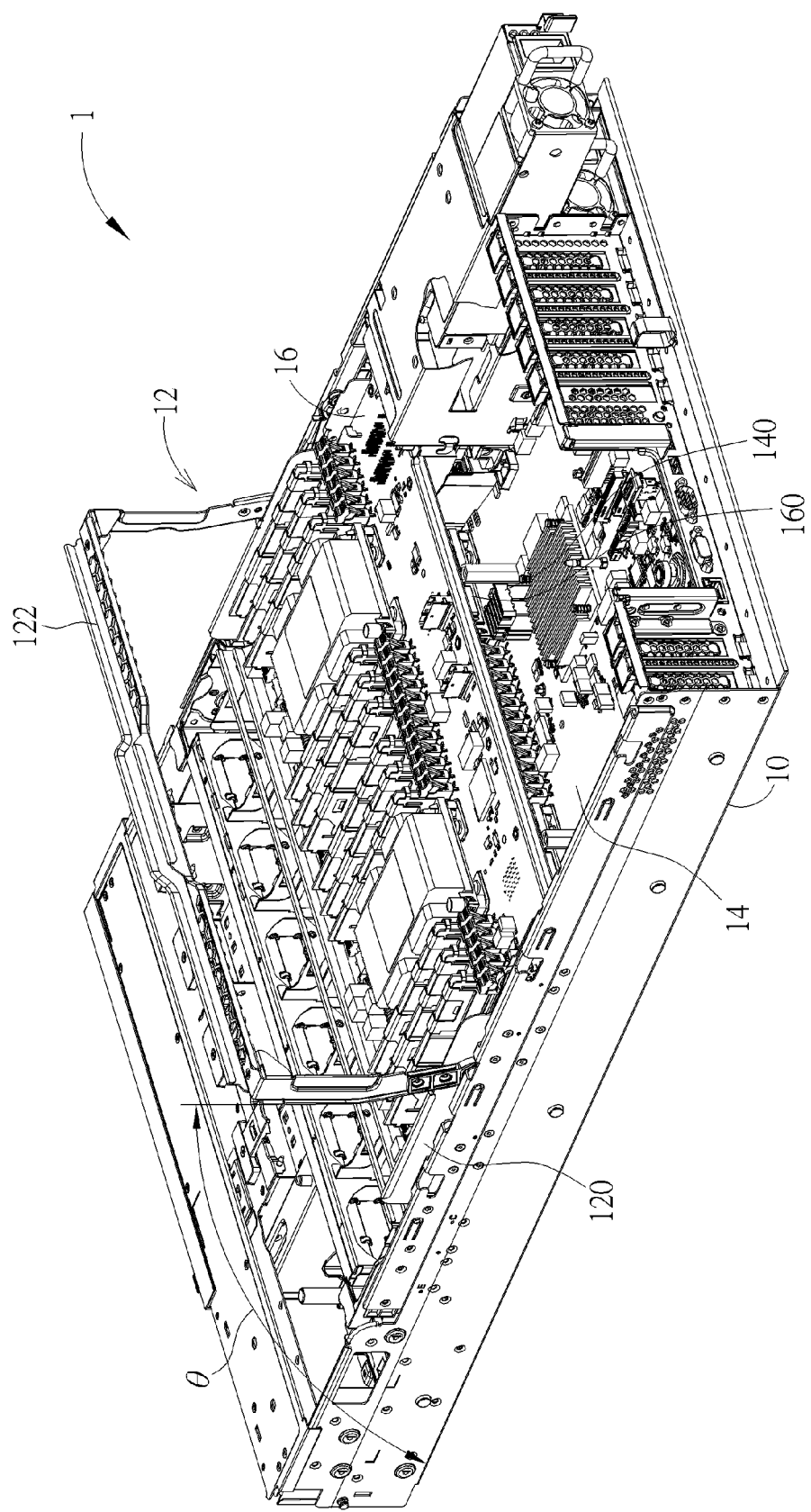
FIG. 9 is a perspective view illustrating the tray shown in FIG. 1 placed into the casing.
Figure 10:
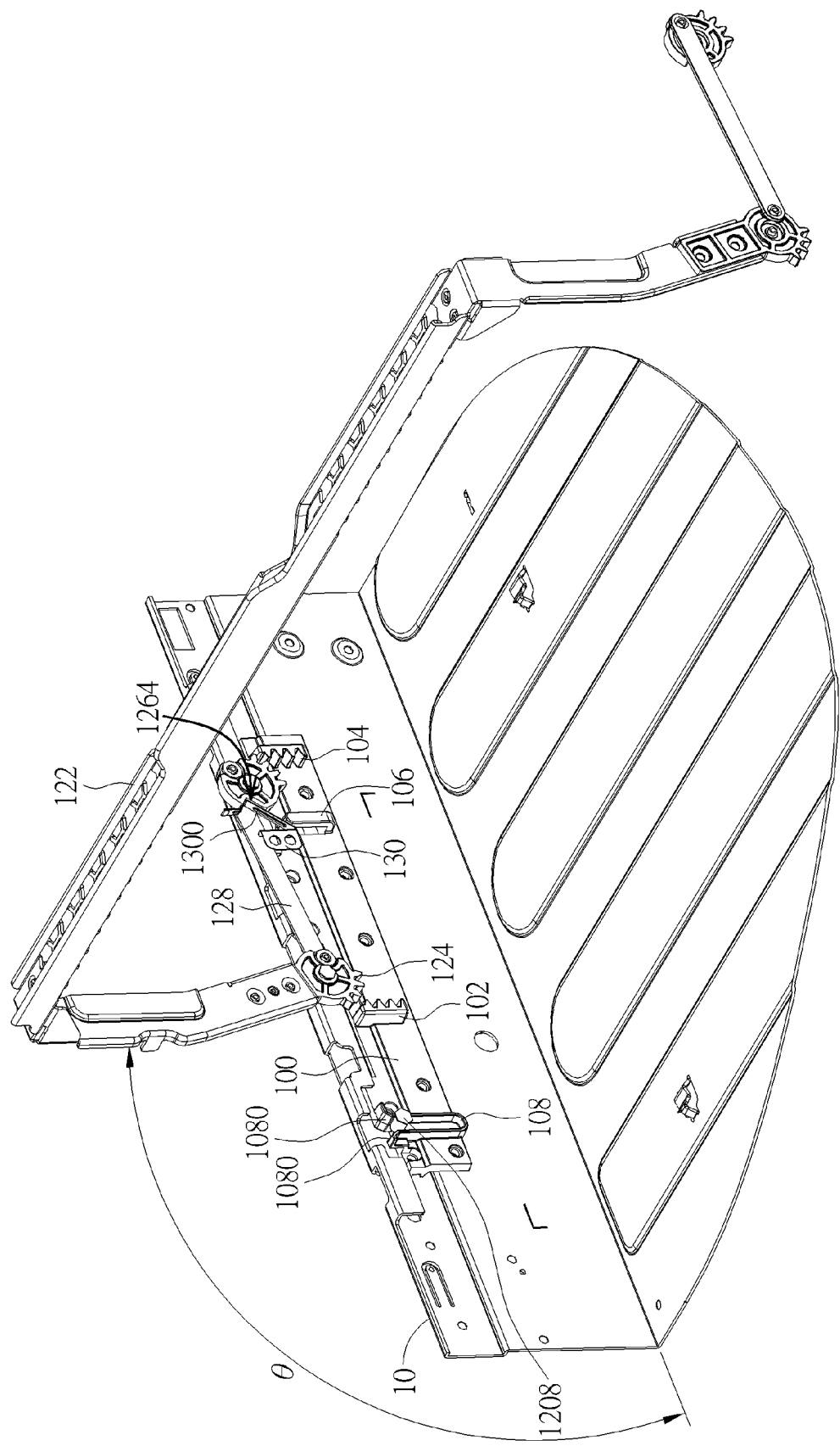
FIG. 10 is a perspective view illustrating some components removed from FIG. 9.
Figure 11:
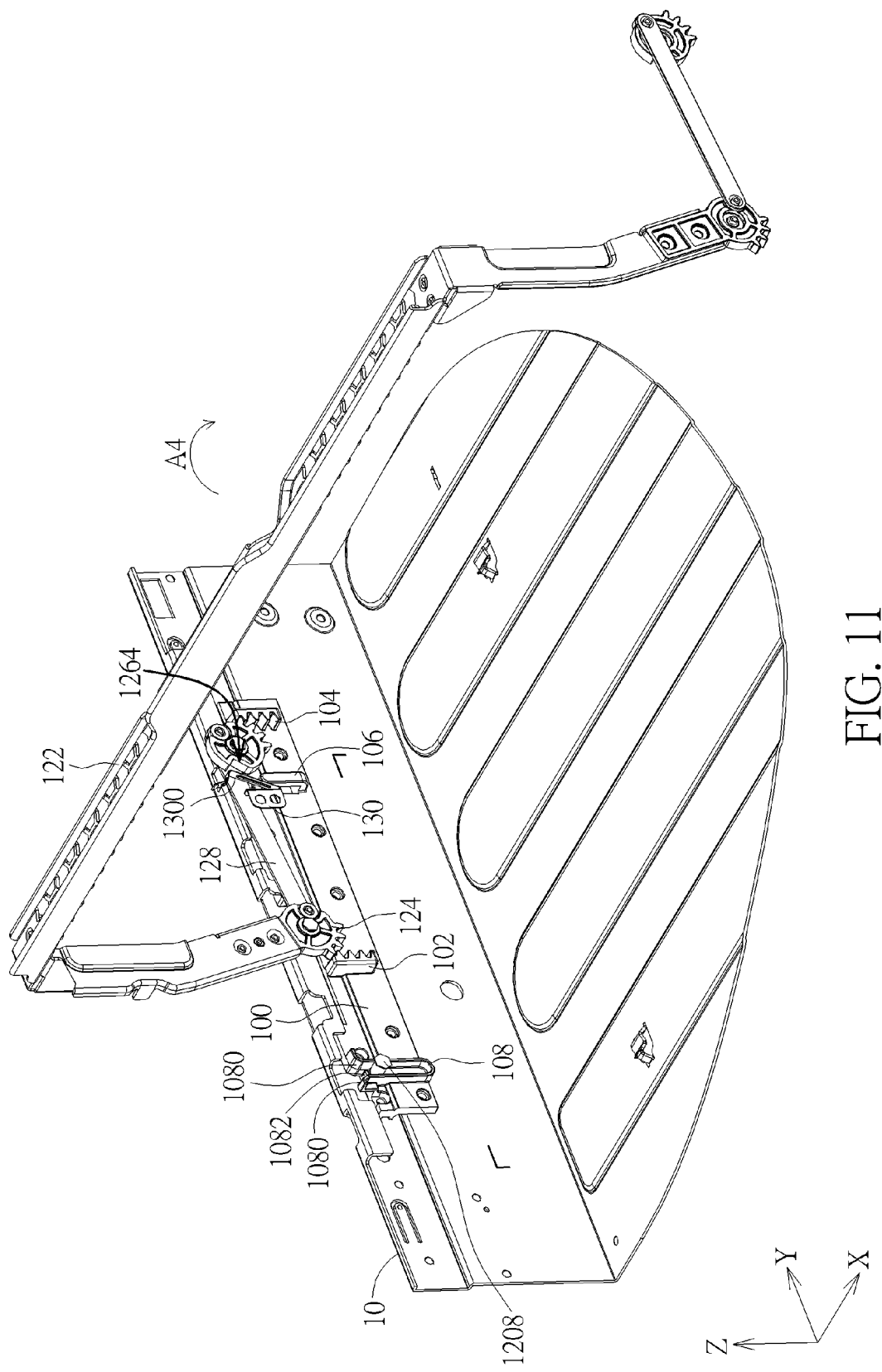
FIG. 11 is a perspective view illustrating the resilient portion shown in FIG. 10 disengaged from the engaging portion.
Figure 12:
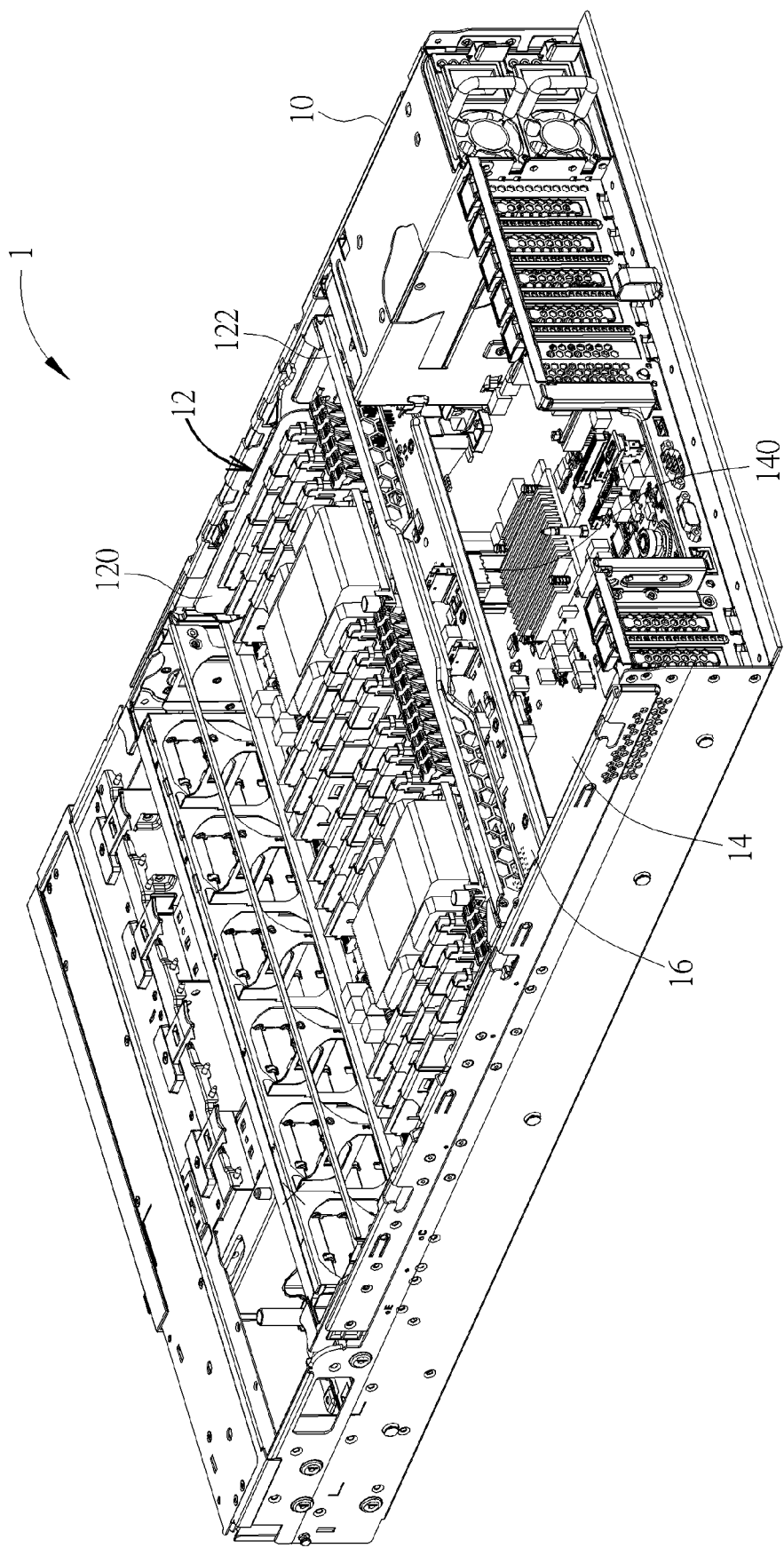
FIG. 12 is a perspective view illustrating the handle shown in FIG. 9 closed with respect to the tray body.
Figure 13:
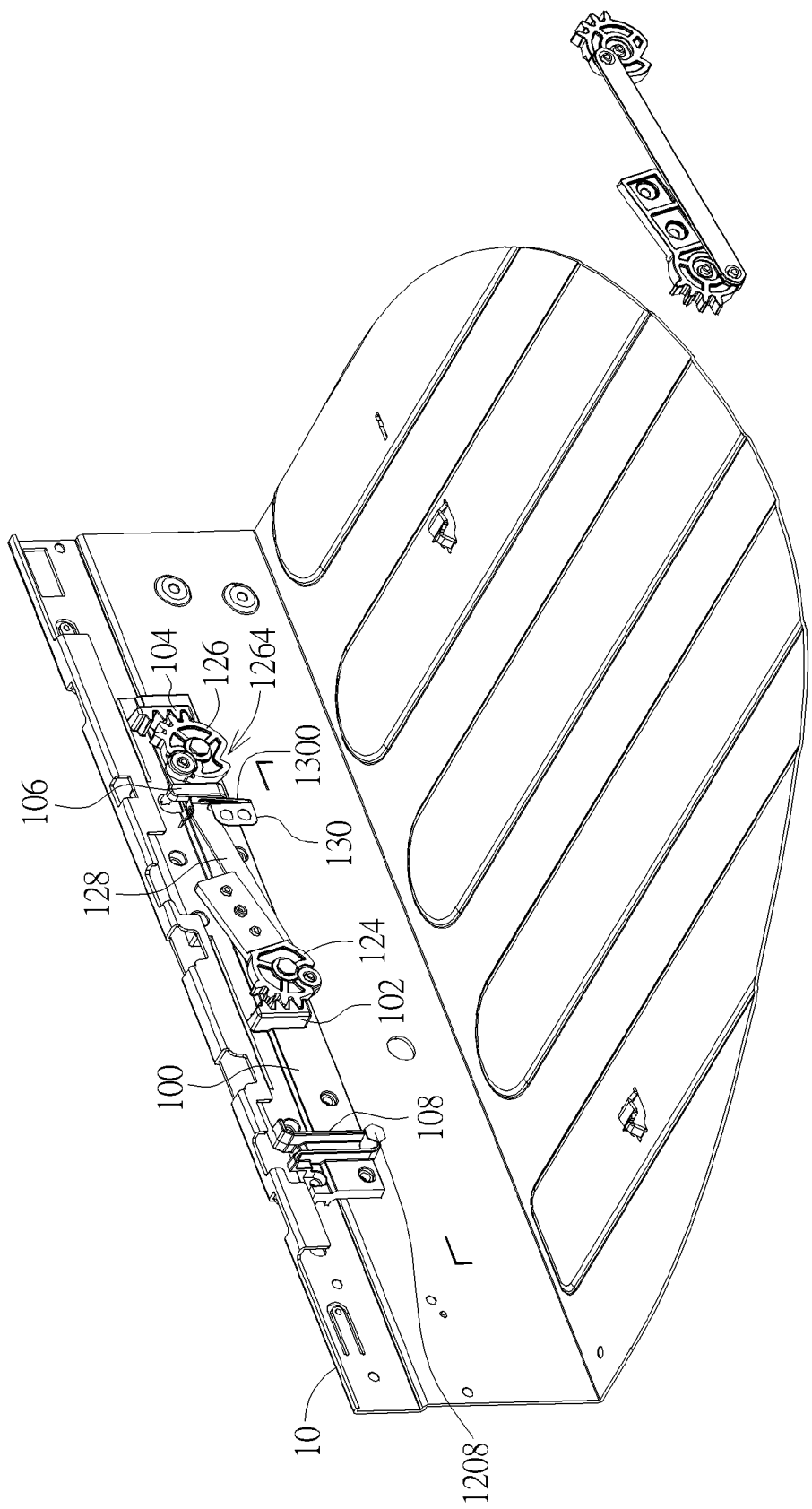
FIG. 13 is a perspective view illustrating some components removed from FIG. 12.

Referring to FIGS. 9 to 13, FIG. 9 is a perspective view illustrating the tray 12 shown in FIG. 1 placed into the casing 10, FIG. 10 is a perspective view illustrating some components removed from FIG. 9, FIG. 11 is a perspective view illustrating the resilient portion 1300 shown in FIG. 10 disengaged from the engaging portion 1264, FIG. 12 is a perspective view illustrating the handle 122 shown in FIG. 9 closed with respect to the tray body 120, and FIG. 13 is a perspective view illustrating some components removed from FIG. 12.

In the following, FIGS. 1 and 9-13 are used to depict the principle of the invention. As shown in FIG. 1, the invention may dispose the first circuit board 14 in the casing 10 of the electronic device 1 and dispose the second circuit board 16 on the tray body 120 of the tray 12, wherein the first circuit board 14 has a first connector 140 and the second circuit board 16 has a second connector 160. The first circuit board 14 and the second circuit board 16 may be connected to each other by the first connector 140 and the second connector 160 correspondingly, so as to establish data and power transmitting path. In this embodiment, the second circuit board 16 has four second connectors 160, so the first circuit board 14 also has four first connectors 140 (FIG. 1 only shows one first connector 140 due to viewing angle). It should be noted that the number and position of the first connector 140 and the second connector 160 may be determined according to practical applications, so they are not limited to the embodiment shown in the figures.

When a user wants to connect the second circuit board 16 with the first circuit board 14, the user can rotate the handle 122 with respect to the tray body 120 to a predetermined angle θ in an open direction indicated by an arrow A3. In this embodiment, the predetermined angle θ may be 90 degrees. However, the predetermined angle θ may be determined according to practical applications, so the predetermined angle θ is not limited to 90 degrees. When the handle 122 rotates with respect to the tray body 120 to the predetermined angle θ in the open direction, the resilient portion 1300 of the block member 130 is engaged with the engaging portion 1264 of the second gear 126 (as shown in FIG. 10), such that the second gear 126 cannot rotate in the direction indicated by the arrow A3, so as to restrain the handle 122 from rotating with respect to the tray body 120 in a close direction indicated by an arrow A4. The close direction indicated by the arrow A4 is opposite to the open direction indicated by the arrow A3. Furthermore, when the handle 122 rotates with respect to the tray body 120 to the predetermined angle θ in the open direction, the handle 122 abuts against the block portion 1200 of the tray body 120 (as shown in FIGS. 1 and 3). Accordingly, the block portion 1200 of the tray body 120 can restrain the handle 122 from continuing to rotate with respect to the tray body 120 in the open direction. In other words, when the handle 122 rotates with respect to the tray body 120 to the predetermined angle θ in the open direction, the handle 122 is located at the predetermined angle θ with respect to the tray body 120 and cannot rotate. Since the handle 122 cannot rotate, the first gear 124 and the second gear 126 cannot rotate either.

Then, the user can place the tray 12 into the casing 10, as shown in FIG. 9. When the handle 122 is located at the predetermined angle θ with respect to the tray body 120 and the tray 12 is placed into the casing 10, the guiding pillar 1208 of the tray body 120 enters the guiding groove 108 of the support frame 100. As shown in FIG. 10, the guiding pillar 1208 of the tray body 120 enters the guiding groove 108 by the guidance of the two end inclines 1080 of the guiding groove 108. As shown in FIG. 11, when the guiding pillar 1208 passes through the two end inclines 1080, the rod member 106 of the support frame 100 moves the resilient portion 1300 of the block member 130, such that the resilient portion 1300 is disengaged from the engaging portion 1264 of the second gear 126. Furthermore, when the resilient portion 1300 is disengaged from the engaging portion 1264 of the second gear 126, the first gear 124 contacts the first rack 102 and the second gear 126 contacts the second rack 104. In this embodiment, the first tooth of the first gear 124 contacts the first tooth of the first rack 102 and the first tooth of the second gear 126 contacts the first tooth of the second rack 104. However, the invention is not limited to the aforesaid manner. The invention may make a specific tooth of the first gear 124 to contact a specific tooth of the first rack 102 and make a specific tooth of the second gear 126 to contact a specific tooth of the second rack 104. In other words, when the guiding pillar 1208 passes through the two end inclines 1080, the first gear 124 and the second gear 126 contact the first rack 102 and the second rack 104, respectively, so as to ensure that the first gear 124 and the second gear 126 mesh with the first rack 102 and the second rack 104 in Y direction, respectively and accurately. Therefore, the second tooth of the first gear 124 will not contact the first tooth of the first rack 102, so as to prevent the second circuit board 16 on the tray 12 from slanting in the beginning. Moreover, when the guiding pillar 1208 passes through the bottom incline 1082 of the guiding groove 108, the invention can ensure the relative position between the second circuit board 16 on the tray 12 and the first circuit board 14 in X direction, so as to ensure that the second circuit board 16 and the first circuit board 14 can be connected to each other accurately.

Since the resilient portion 1300 of the block member 130 is disengaged from the engaging portion 1264 of the second gear 126, the handle 122 can be operated to rotate with respect to the tray body 120 in the close direction indicated by the arrow A4. When the user operates the handle 122 to rotate with respect to the tray body 120 in the close direction, the first gear 124 meshes with the first rack 102 and rotates and the first gear 124 drives the second gear 126 to mesh with the second rack 104 and rotate through the linking member 128, such that the tray body 120 moves downwardly in a direction (i.e. Z direction) parallel to the first rack 102 and the second rack 104. At this time, the second circuit board 16 together with the tray 12 moves toward the first circuit board 14.

As shown in FIG. 12, when the handle 122 is closed with respect to the tray body 120, the tray 12 and the second circuit board 16 descend to the lowest position. At this time, the first connector 140 of the first circuit board 14 and the second connector 160 of the second circuit board 16 are connected to each other, so as to establish data and power transmitting path. Furthermore, since the first gear 124 and the second gear 126 mesh with the first rack 102 and the second rack 104, respectively (as shown in FIG. 13), the position of the tray 12 and the second circuit board 16 is locked accordingly.

When the user wants to detach the second circuit board 16 from the first circuit board 14, the user can rotate the handle 122 with respect to the tray body 120 in the open direction, such that the first gear 124 meshes with the first rack 102 and rotates and the first gear 124 drives the second gear 126 to mesh with the second rack 104 and rotate through the linking member 128. At this time, the tray body 120 moves upwardly in a direction parallel to the first rack 102 and the second rack 104. When the handle 122 rotates with respect to the tray body 120 to the predetermined angle θ in the open direction, the first connector 140 of the first circuit board 14 and the second connector 160 of the second circuit board 16 are separated from each other. At the same time, the resilient portion 1300 of the block member 130 comes off the rod member 106 of the support frame 100 and then is engaged with the engaging portion 1264 of the second gear 126, so as to restrain the handle 122 from rotating with respect to the tray body 120 in the close direction. At this time, the user can grasp the handle 122 to remove the tray body 120 with the second circuit board 16 thereon from the casing 10 of the electronic device 1.

In this embodiment, the first gear 124 and the second gear 126 have identical number of teeth and modules, such that the first gear 124 and the second gear 126 can rotate with respect to the first rack 102 and the second rack 104, respectively and synchronously, and a rotating speed of the first gear 124 can be identical to a rotating speed of the second gear 126. Accordingly, the invention can ensure that the tray 12 moves with respect to the casing horizontally and smoothly.

Figure 14:
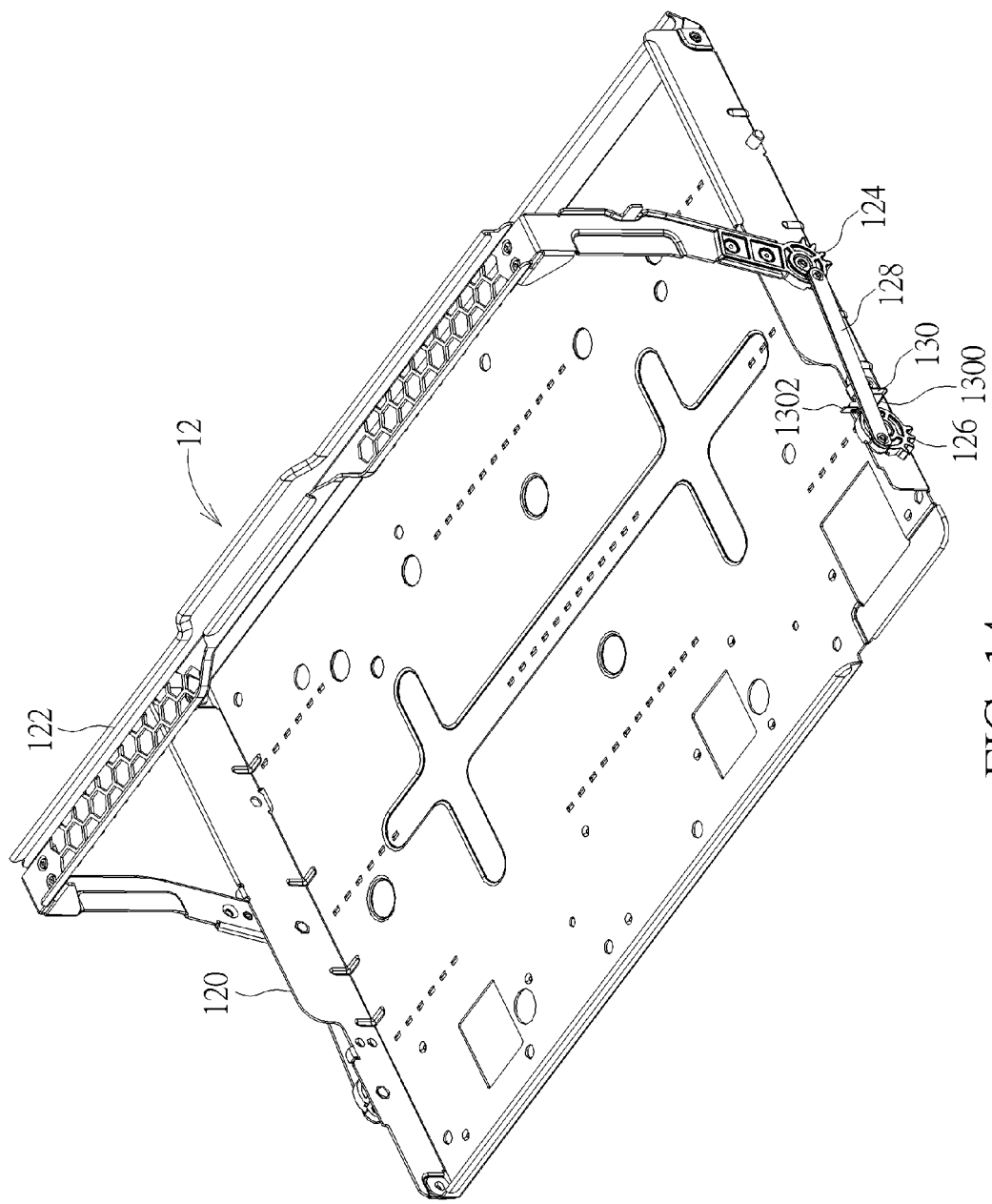
FIG. 14 is a perspective view illustrating the second circuit board shown in FIG. 3 removed from the tray.
Figure 15:
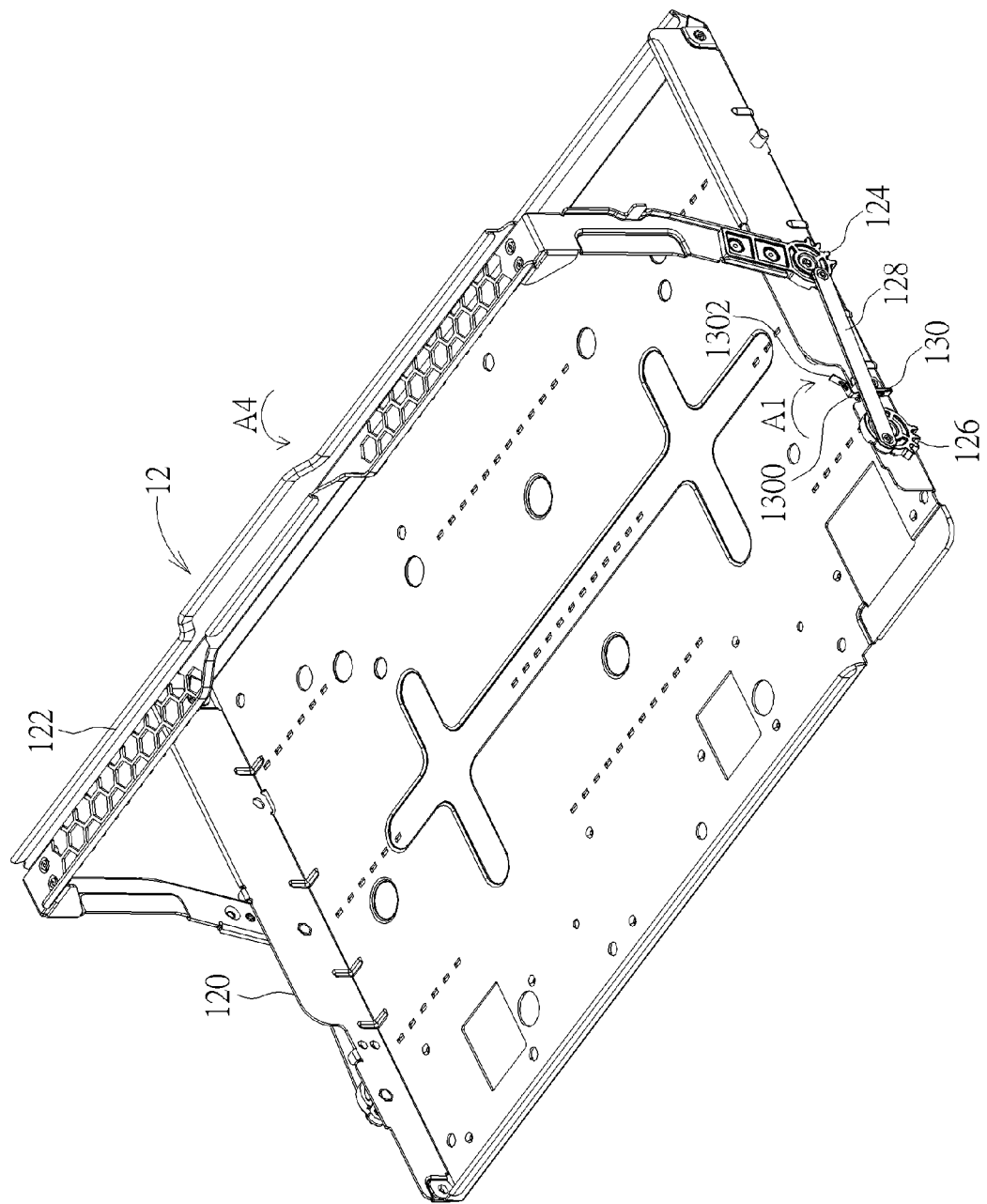
FIG. 15 is a perspective view illustrating the block member shown in FIG. 14 disengaged from the second gear.

Referring to FIGS. 14 and 15, FIG. 14 is a perspective view illustrating the second circuit board 16 shown in FIG. 3 removed from the tray 12, and FIG. 15 is a perspective view illustrating the block member 130 shown in FIG. 14 disengaged from the second gear 126. As shown in FIG. 14, the second circuit board 16 may be removed from the tray 12. Since the resilient portion 1300 of the block member 130 is engaged with the engaging portion 1264 (not shown in FIG. 14) of the second gear 126, the handle 122 cannot rotate. When the user wants to store or transport the tray 12, the user can press the press portion 1302 of the block member 130 in the direction indicated by the arrow A1, as shown in FIG. 15. At this time, the press portion 1302 drives the resilient portion 1300 to deform elastically in the direction indicated by the arrow A1, such that the resilient portion 1300 is disengaged from the engaging portion 1264 (not shown in FIG. 15) of the second gear 126. Then, the user can operate the handle 122 to rotate with respect to the tray body 120 in the close direction indicated by the arrow A4, so as to close the handle 122 with respect to the tray body 120. Accordingly, the invention can save packing space for the tray 12.

Figure 16:
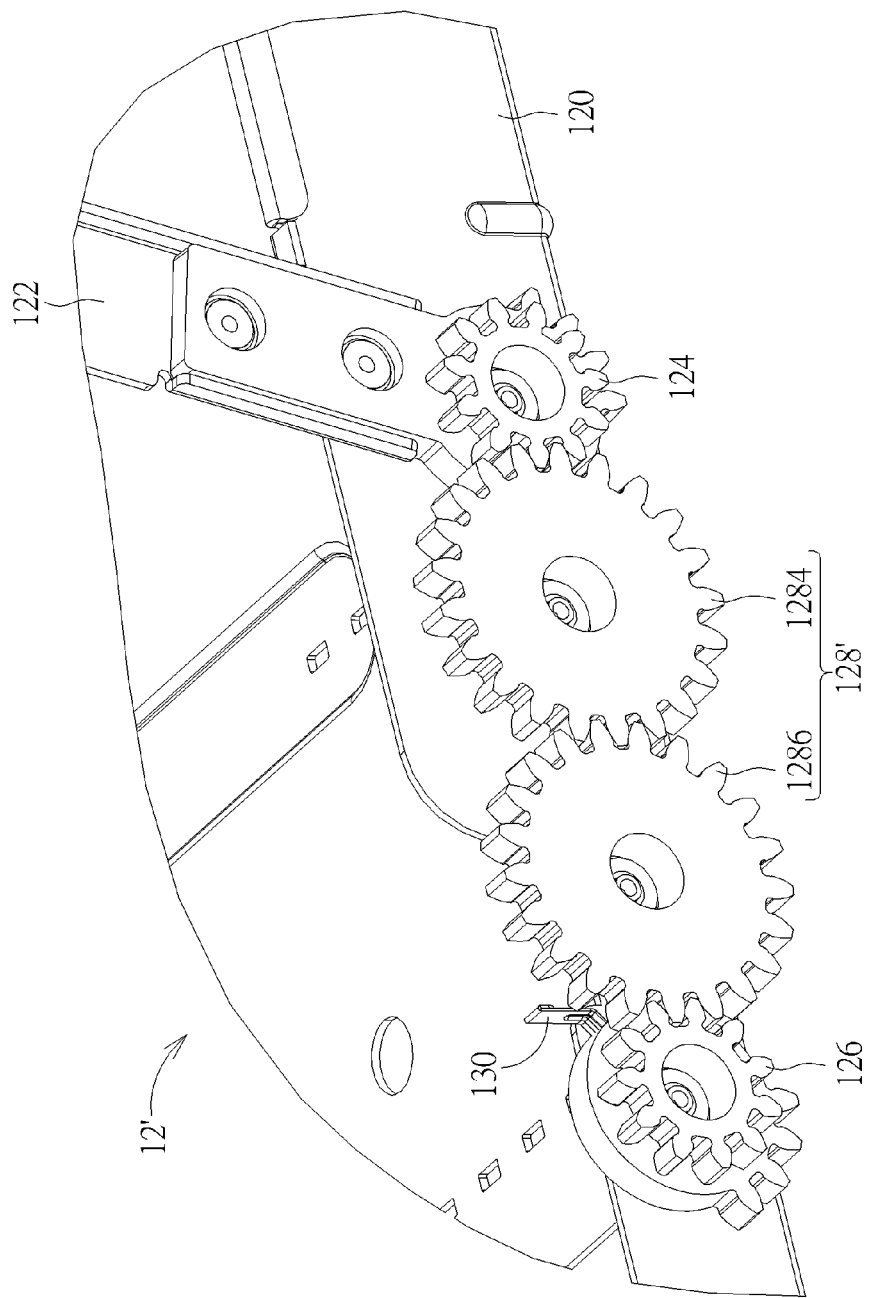
FIG. 16 is a perspective view illustrating parts of a tray according to another embodiment of the invention.

Referring to FIG. 16, FIG. 16 is a perspective view illustrating parts of a tray 12' according to another embodiment of the invention. The main difference between the tray 12' and the aforesaid tray 12 is that the linking member 128' of the tray 12' is a reversing gear set. As shown in FIG. 16, the linking member 128' comprises two reversing gears 1284, 1286, wherein the first gear 124 meshes with the reversing gear 1284, the reversing gear 1284 meshes with the reversing gear 1286, and the reversing gear 1286 meshes with the second gear 126. Accordingly, the first gear 124 can drive the second gear 126 to rotate through the reversing gears 1284, 1286. In other words, the invention may replace the aforesaid linking member 128 by the two reversing gears 1284, 1286 of the linking member 128'.

Figure 17:
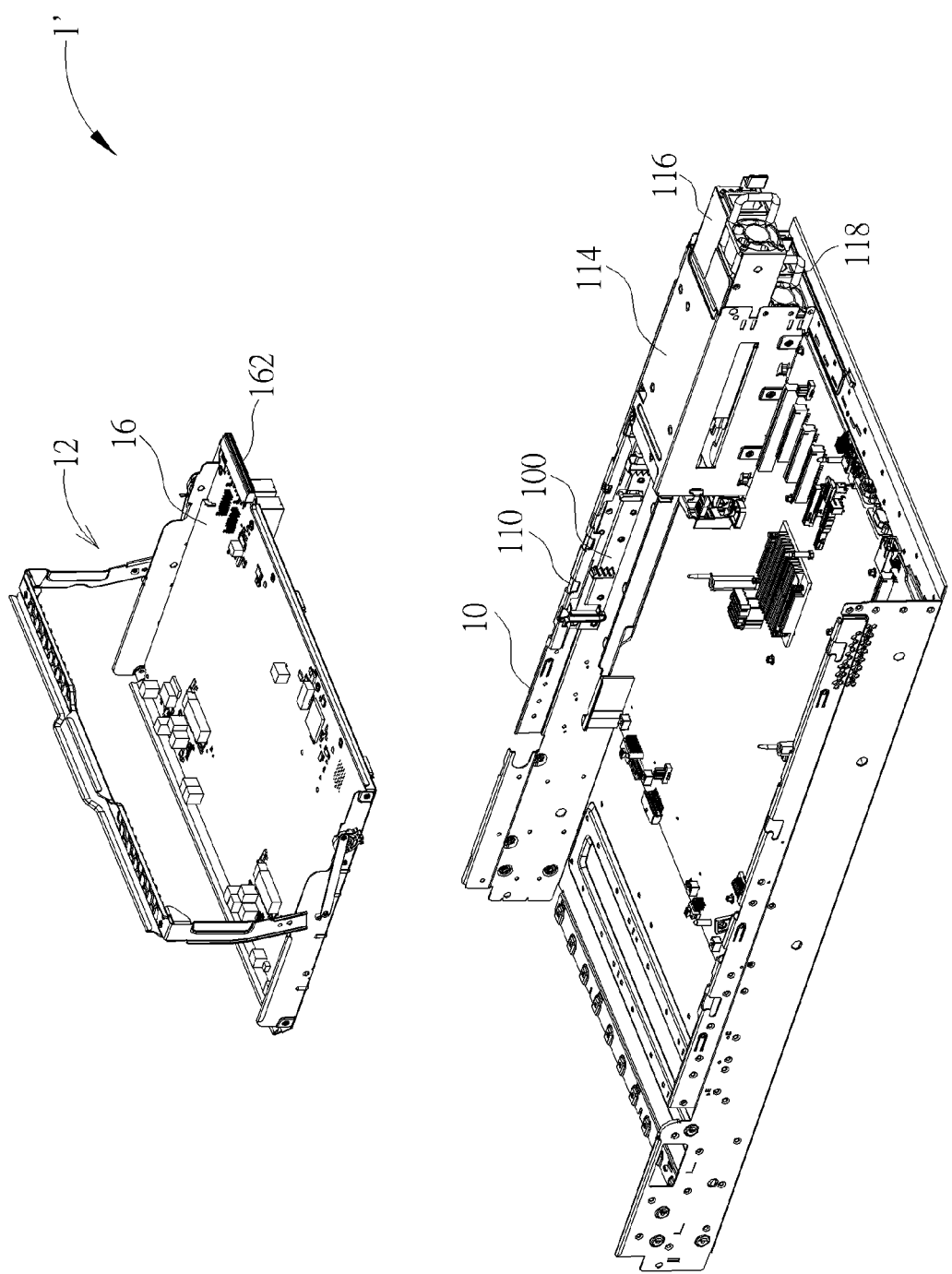
FIG. 17 is an exploded view illustrating an electronic device according to another embodiment of the invention.
Figure 18:
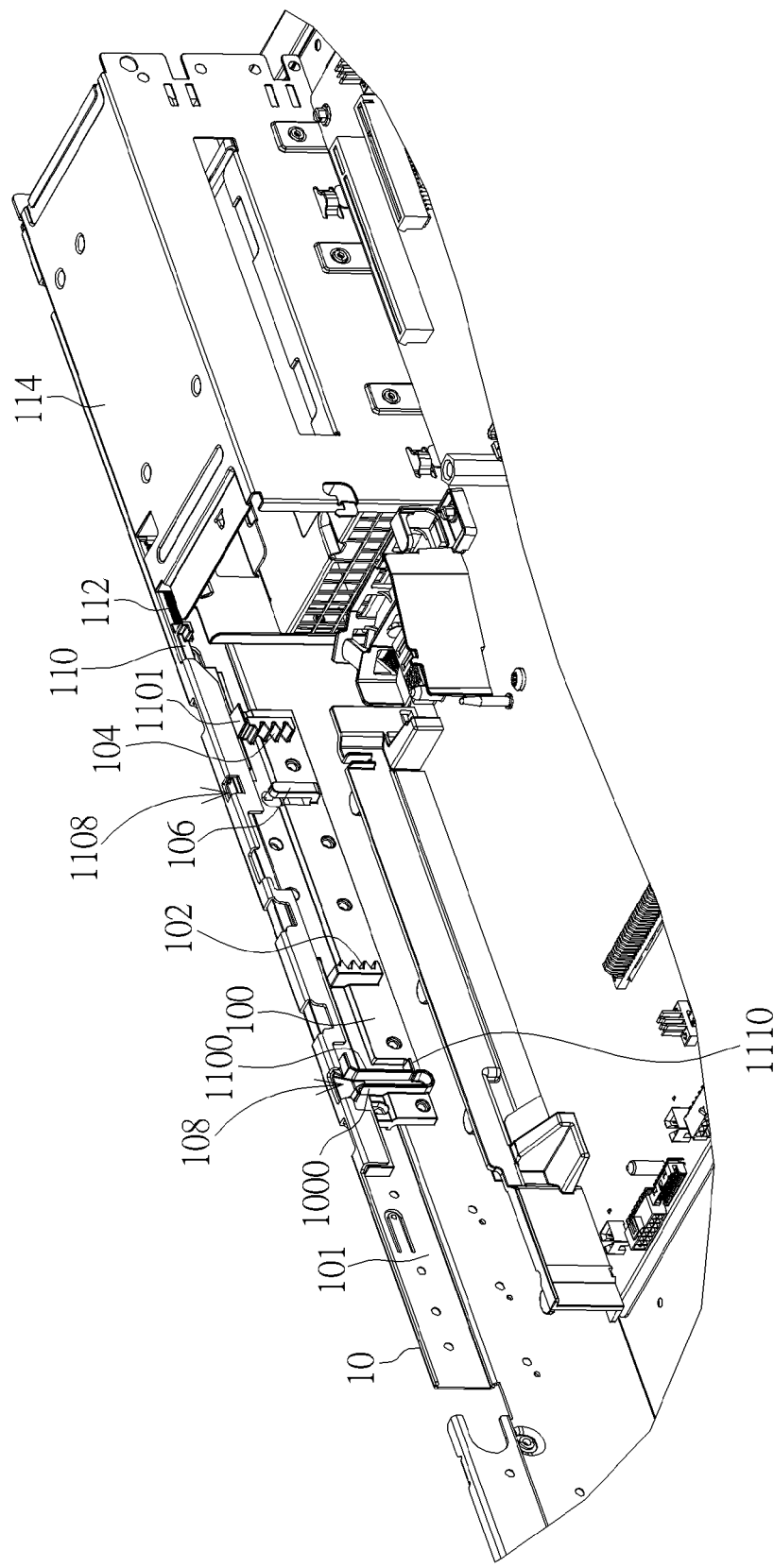
FIG. 18 is a perspective view illustrating the casing shown in FIG. 17 from another viewing angle, wherein the protection frame is located at the recovery position.
Figure 19:
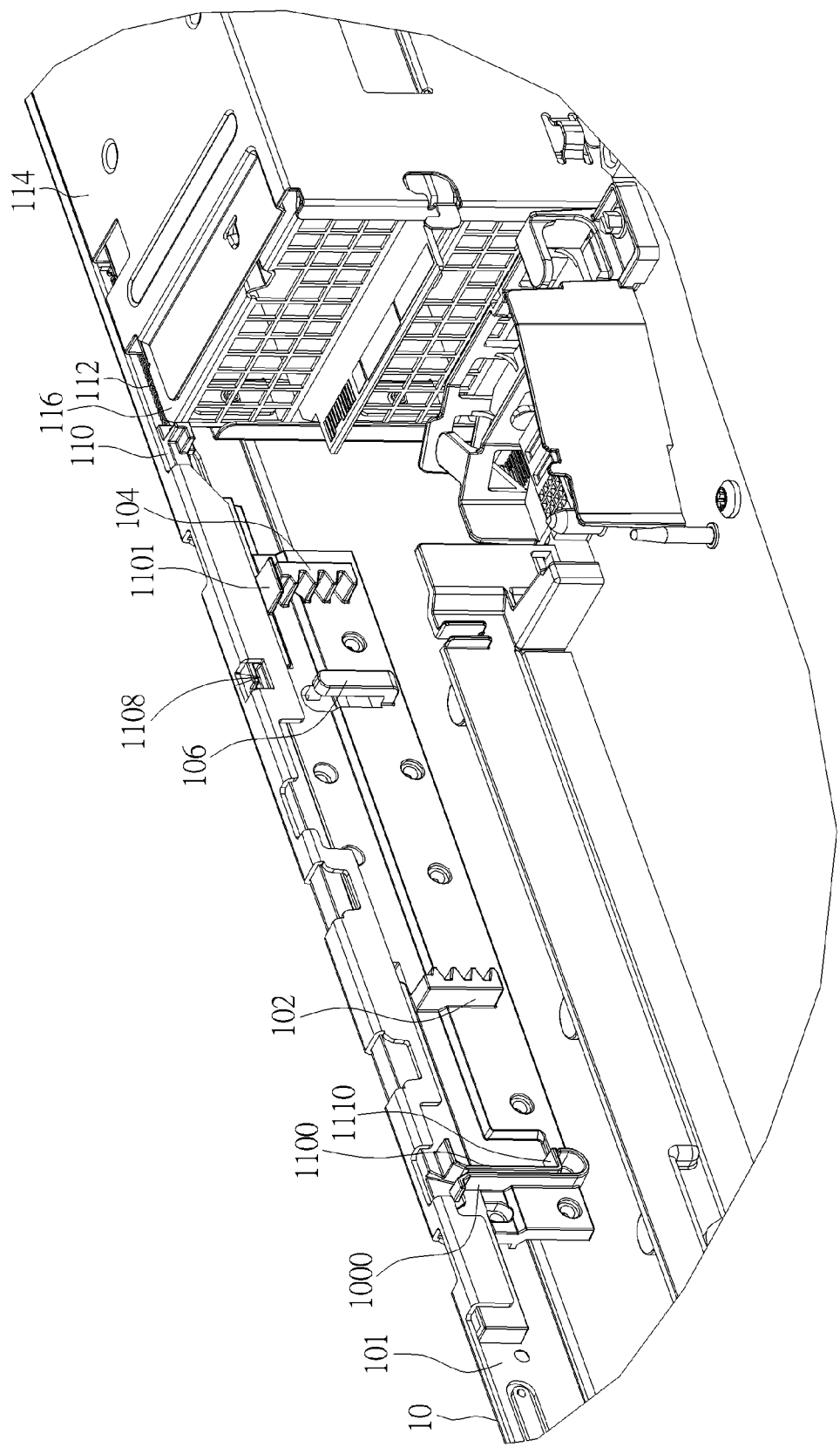
FIG. 19 is a perspective view illustrating the protection frame shown in FIG. 18 located at the protection position.
Figure 20:
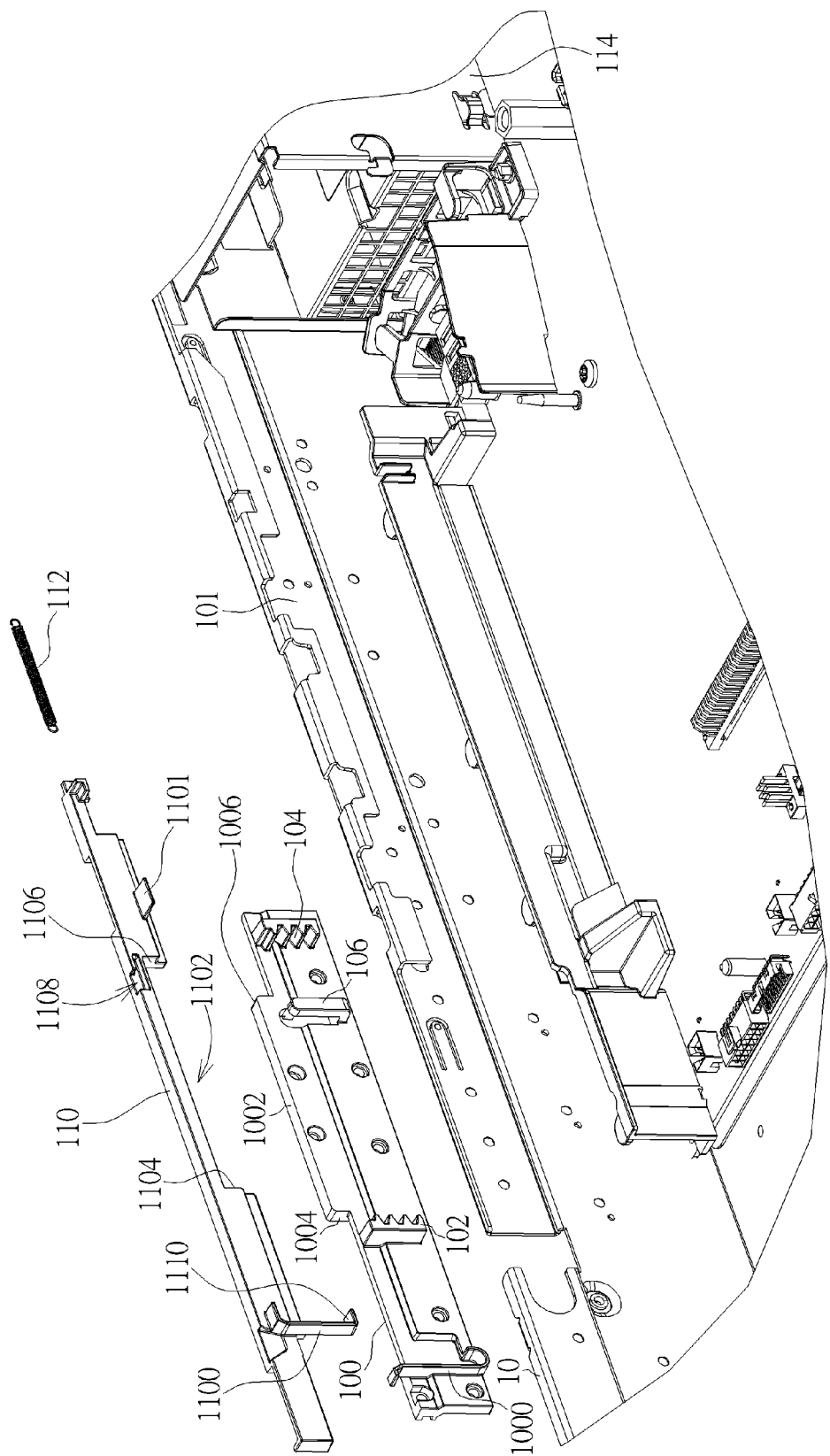
FIG. 20 is an exploded view illustrating the support frame, the protection frame and the resilient member shown in FIG. 18.
Figure 21:
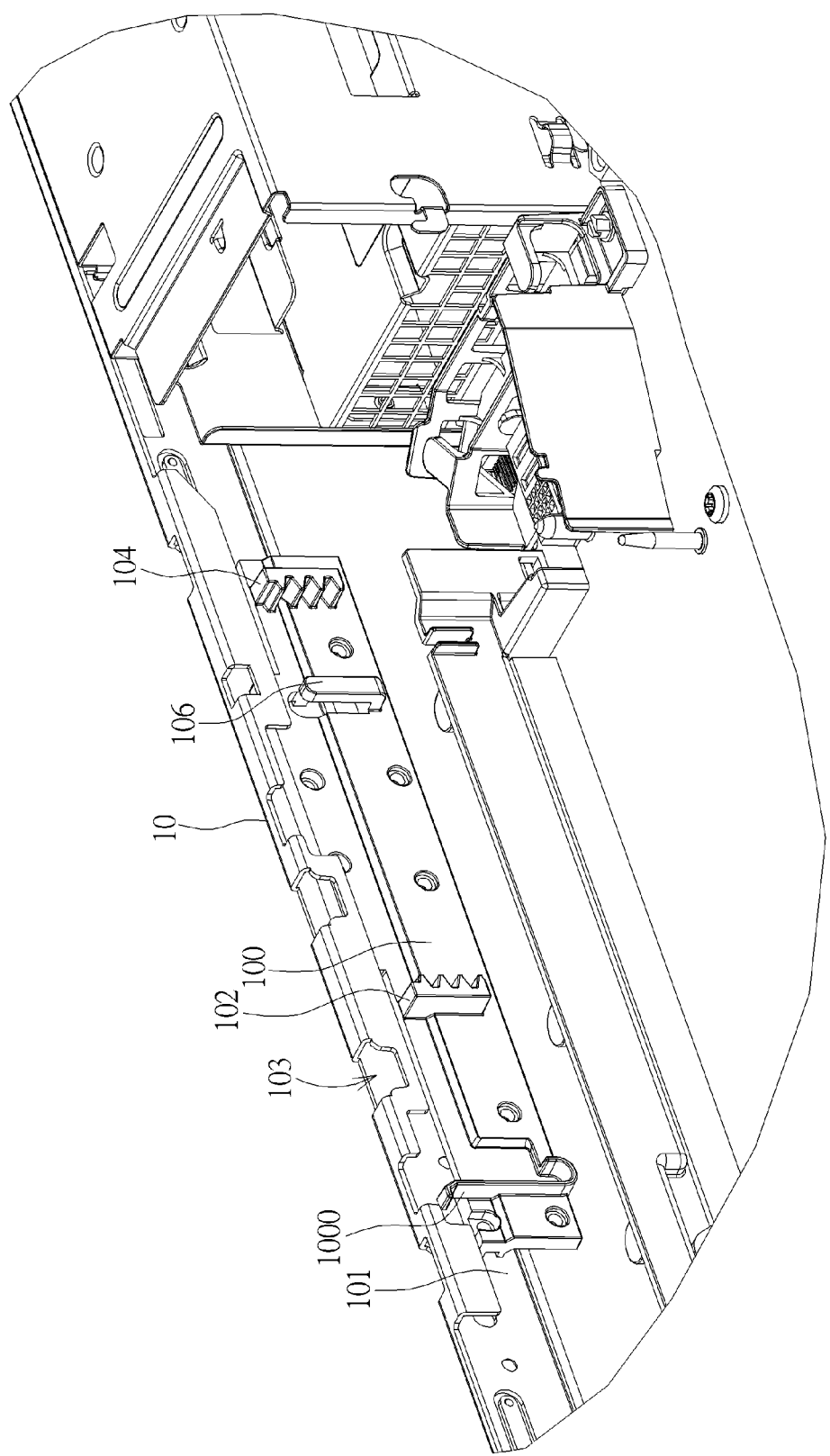
FIG. 21 is a perspective view illustrating the support frame shown in FIG. 20 disposed on the casing.
Figure 22:
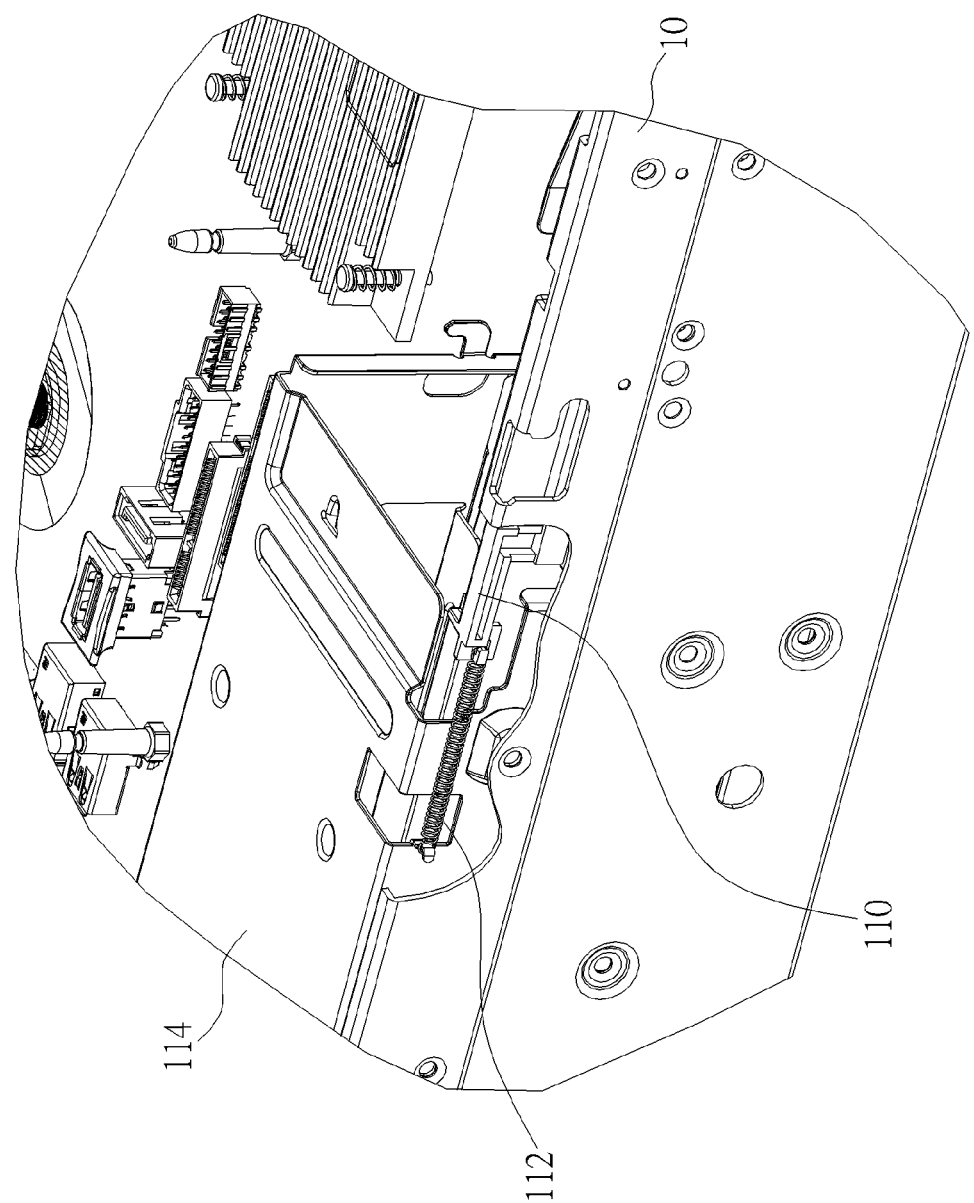
FIG. 22 is a rear perspective view illustrating the resilient member shown in FIG. 20 connected to the protection frame and the power box.

Referring to FIGS. 17 to 22, FIG. 17 is an exploded view illustrating an electronic device 1' according to another embodiment of the invention, FIG. 18 is a perspective view illustrating the casing 10 shown in FIG. 17 from another viewing angle, wherein the protection frame 110 is located at the recovery position, FIG. 19 is a perspective view illustrating the protection frame 110 shown in FIG. 18 located at the protection position, FIG. 20 is an exploded view illustrating the support frame 100, the protection frame 110 and the resilient member 112 shown in FIG. 18, FIG. 21 is a perspective view illustrating the support frame 100 shown in FIG. 20 disposed on the casing 10, and FIG. 22 is a rear perspective view illustrating the resilient member 112 shown in FIG. 20 connected to the protection frame 110 and the power box 114.

The main difference between the electronic device 1' and the aforesaid electronic device 1 is that the electronic device 1' further comprises a protection frame 110 and a resilient member 112. The structural design and principle of the tray 12 have been mentioned in the above, so those will not be depicted herein again. Furthermore, the electronic device 1' comprises a power box 114. The power box 114 is disposed in the casing 10 and used for accommodating an upper power supply 116 and a lower power supply 118. To assemble the second circuit board 16 and the upper power supply 116, the user has to establish electrical connection between the first circuit board 14 and the second circuit board 16 first according to the aforesaid operation and then places the upper power supply 116 into the power box 114, so as to make the upper power supply 116 to be electrically connected to a power connector 162 of the second circuit board 16. To disassemble the second circuit board 16 and the upper power supply 116, the user has to remove the upper power supply 116 first and then separates the first circuit board 14 and the second circuit board 16 from each other according to the aforesaid operation. If the user assembles or disassembles the second circuit board 16 without removing the upper power supply 116 in advance, the power connector 162 of the second circuit board 16 and/or a plug of the upper power supply 116 may be damaged. Therefore, the invention uses the protection frame 110 to prevent the power connector 162 of the second circuit board 16 and/or the plug of the upper power supply 116 from being damaged due to misoperation by the user.

As shown in FIG. 21, when the support frame 100 is disposed on a side wall 101 of the casing 10, a sliding groove 103 is formed between the support frame 100 and the side wall 101 of the casing 10. The protection frame 110 is disposed in the sliding groove 103 and capable of sliding between a recovery position (as shown in FIG. 18) and a protection position (as shown in FIG. 19). In this embodiment, the support frame 100 further has a first side wall 1000 and the protection frame 110 has a second side wall 1100 and a protection cover 1101. As shown in FIG. 18, when the protection frame 110 is located at the recovery position, a guiding groove 108 is formed between the first side wall 1000 of the support frame 100 and the second side wall 1100 of the protection frame 110. As shown in FIG. 19, when the protection frame 110 is located at the protection position, the first side wall 1000 of the support frame 100 and the second side wall 1100 of the protection frame 110 abut against each other, the guiding groove 108 disappears, and the protection cover 1101 of the protection frame 110 covers the second rack 104.

As shown in FIG. 20, the support frame 100 further has a protruding platform 1002, wherein the protruding platform 1002 has a first block surface 1004 and a second block surface 1006. Furthermore, the protection frame 110 further has a recess 1102, wherein the recess 1102 has a third block surface 1104 and a fourth block surface 1106. When the support frame 100 is disposed on the side wall 101 of the casing 10 and the protection frame 110 is disposed in the sliding groove 103, the protruding platform 1002 of the support frame 100 is located in the recess 1102 of the protection frame 110, wherein the first block surface 1004 of the protruding platform 1002 is opposite to the third block surface 1104 of the recess 1102 and the second block surface 1006 of the protruding platform 1002 is opposite to the fourth block surface 1106 of the recess 1102. When the protection frame 110 is located at the recovery position shown in FIG. 18, the first block surface 1004 of the protruding platform 1002 retains the third block surface 1104 of the recess 1102, so as to restrain the protection frame 110 from continuing to slide. On the other hand, when the protection frame 110 is located at the protection position shown in FIG. 19, the second block surface 1006 of the protruding platform 1002 retains the fourth block surface 1106 of the recess 1102, so as to restrain the protection frame 110 from continuing to slide. In other words, by the cooperation between the protruding platform 1002 of the support frame 100 and the recess 1102 of the protection frame 110, the invention can limit the protection frame 110 to slide between the recovery position shown in FIG. 18 and the protection position shown in FIG. 19.

As shown in FIG. 22, opposite ends of the resilient member 112 are connected to the protection frame 110 and the power box 114. In this embodiment, the resilient member 112 may be a tension spring. As shown in FIG. 19, when the upper power supply 116 is placed into the power box 114, the upper power supply 116 pushes and abuts against the protection frame 110, such that the protection frame 110 slides to the protection position. At this time, the resilient member 112 is extended to store elastic potential energy. As shown in FIG. 18, when the upper power supply 116 is removed, the resilient member 112 generates elastic potential energy to pull the protection frame 110 to return to the recovery position.

Figure 23:
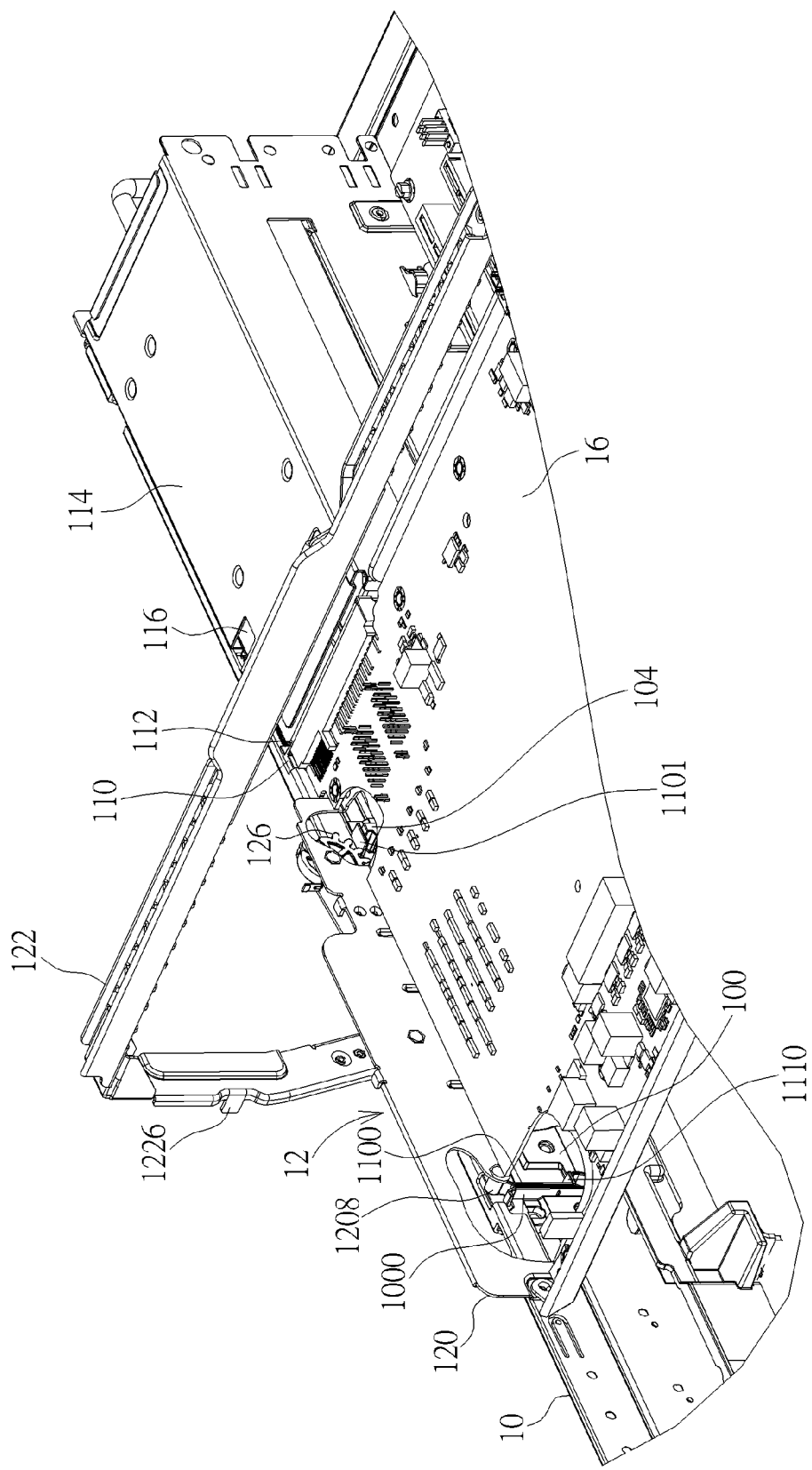
FIG. 23 is perspective view illustrating that the tray is placed into the casing while the protection frame is located at the protection position.

Referring to FIG. 23, FIG. 23 is perspective view illustrating that the tray 12 is placed into the casing 10 while the protection frame 110 is located at the protection position. To show the relative relation between the components, parts of the tray body 120 and the second circuit board 16 shown in FIG. 23 are cut off. As shown in FIG. 23, when the upper power supply 116 is placed into the power box 114 in the beginning, the upper power supply 116 pushes the protection frame 110 to the protection position. At this time, the first side wall 1000 of the support frame 100 and the second side wall 1100 of the protection frame 110 abut against each other, such that the guiding groove 108 disappears. When the user places the tray 12 into the casing 10, the guiding pillar 1208 of the tray body 120 is retained outside the first side wall 1000 and the second side wall 1100. At the same time, the protection cover 1101 of the protection frame 110 covers the second rack 104 of the support frame 100. Accordingly, the second gear 126 of the tray 12 is also retained outside the protection cover 1101 and cannot contact the second rack 104. Accordingly, when the upper power supply 116 has been placed into the power box 114 in the beginning, the tray 12 cannot drive the second circuit board 16 to move downwardly, so as to prevent the power connector 162 of the second circuit board 16 and/or the plug of the upper power supply 116 from being damaged due to collision.

Figure 24:
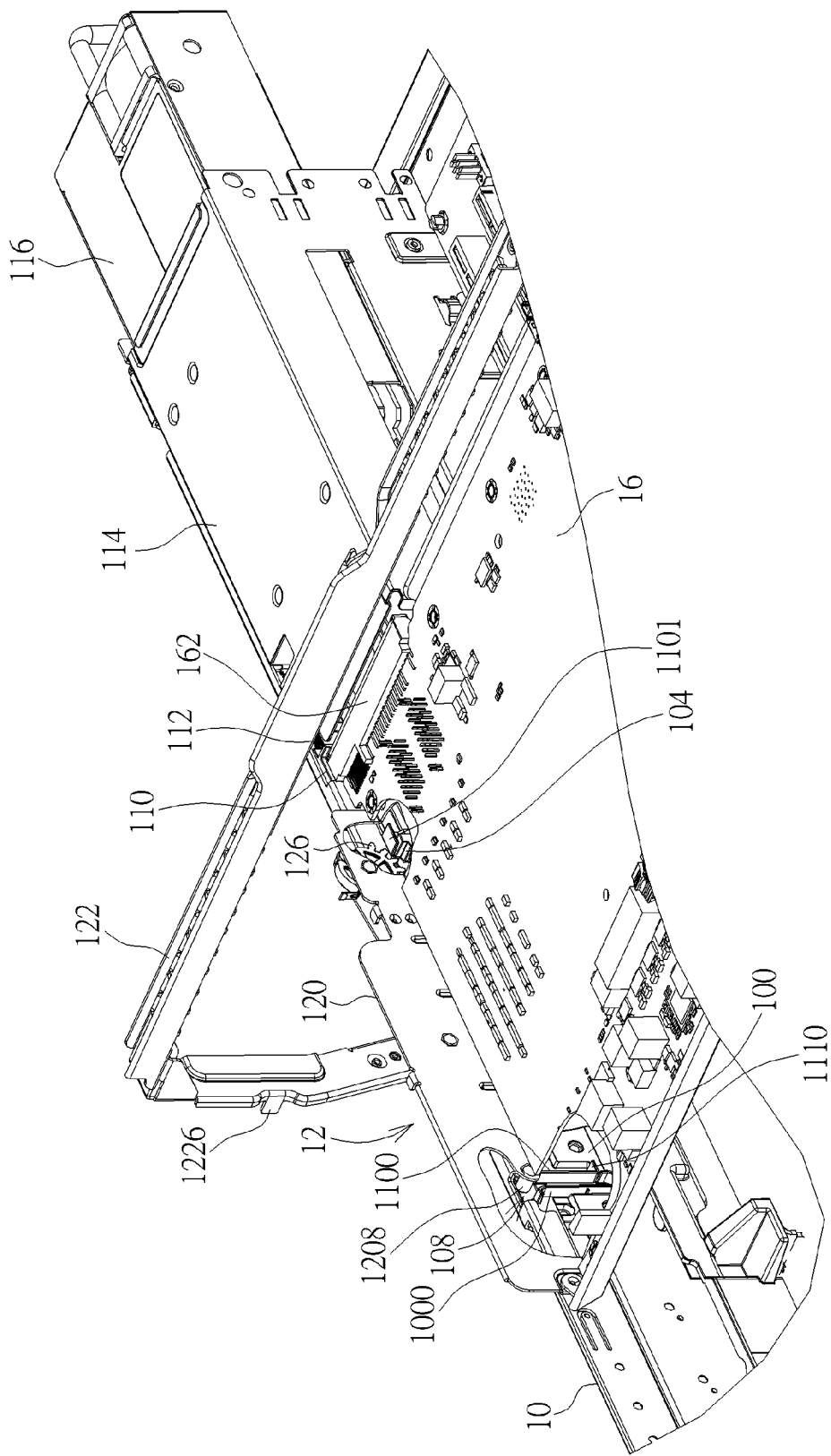
FIG. 24 is a perspective view illustrating that the tray is placed into the casing while the protection frame is located at the recovery position.
Figure 25:
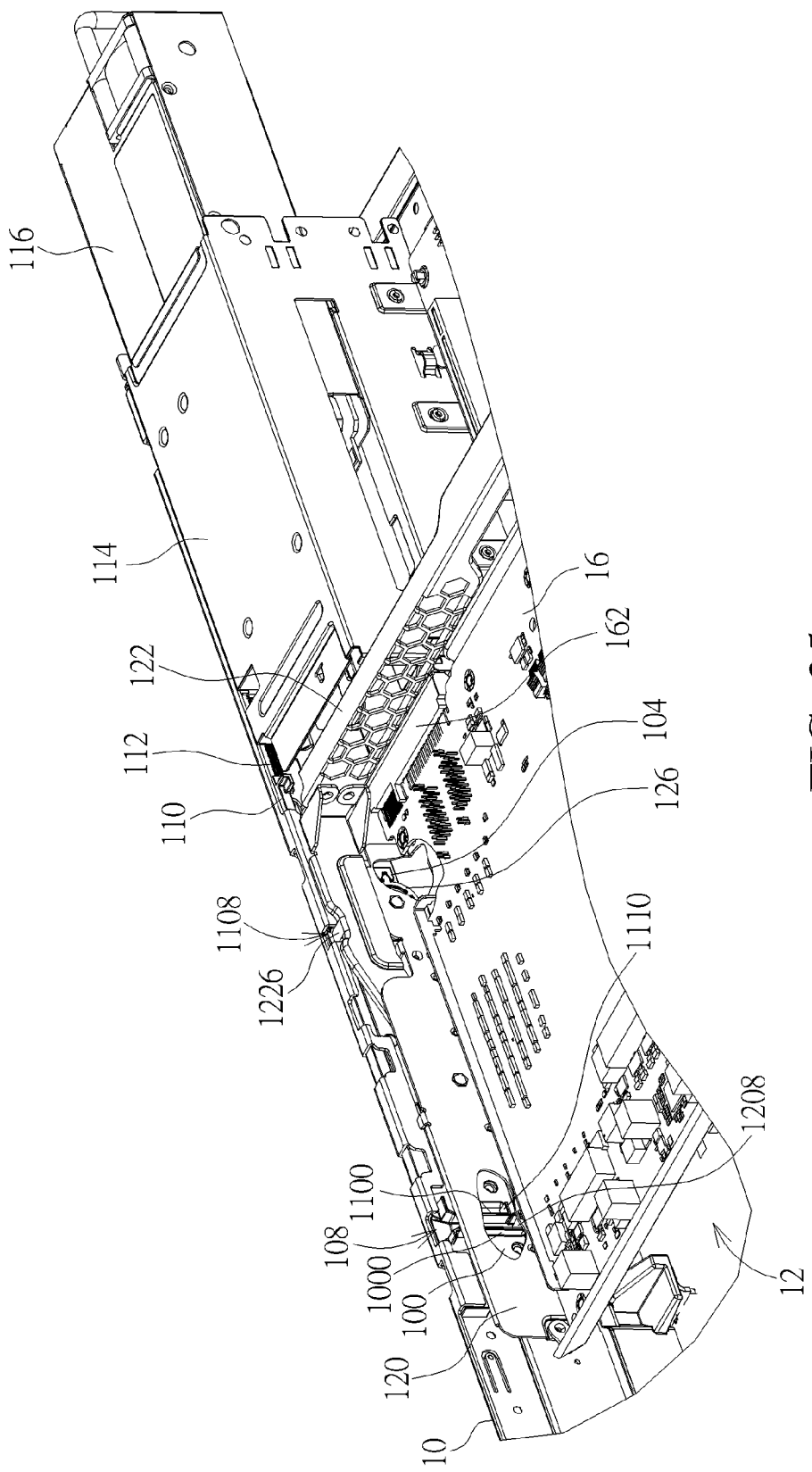
FIG. 25 is a perspective view illustrating the handle shown in FIG. 24 closed with respect to the tray body.
Figure 26:
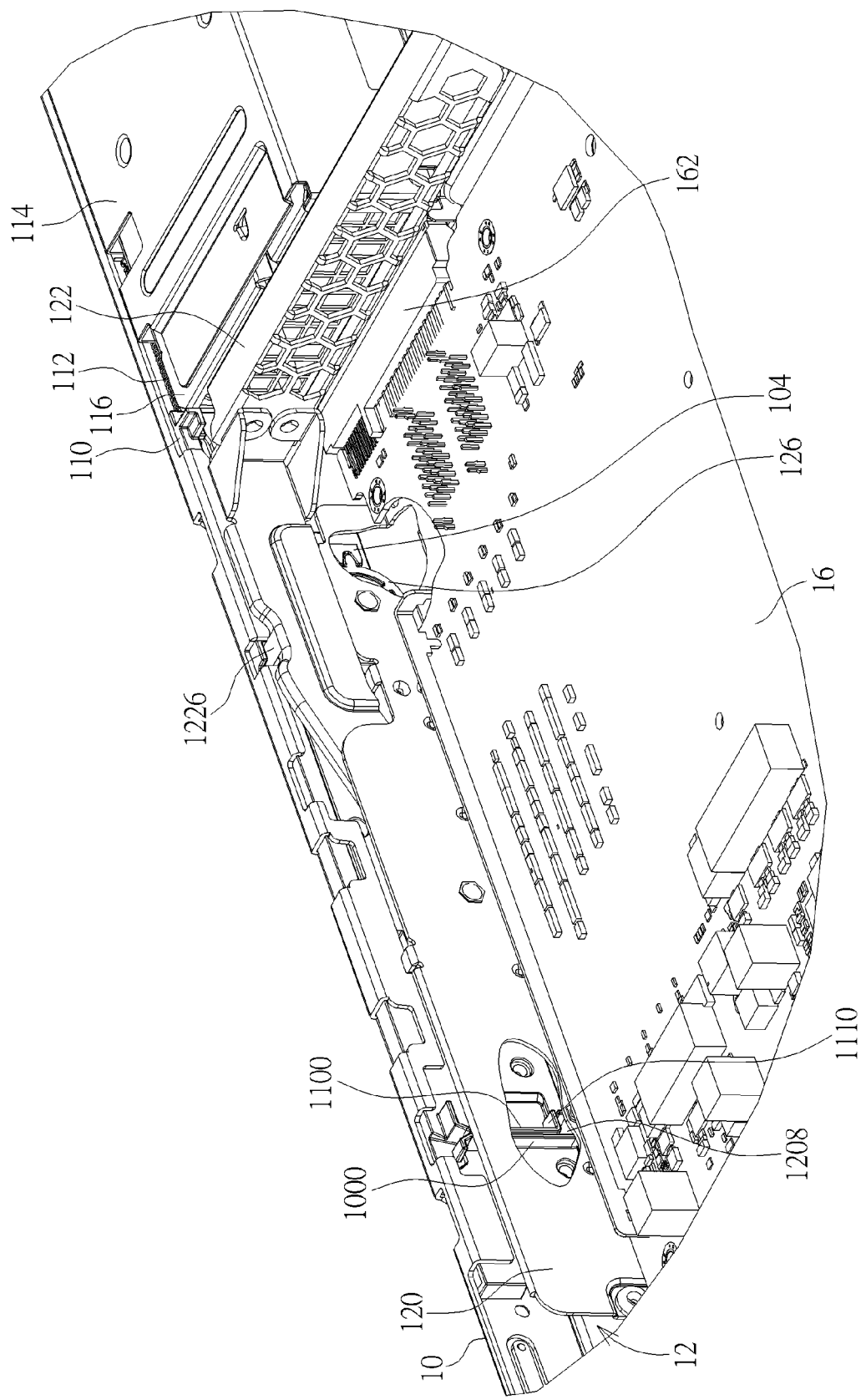
FIG. 26 is a perspective view illustrating the protection frame shown in FIG. 25 sliding to the protection position.

Referring to FIGS. 24 to 26, FIG. 24 is a perspective view illustrating that the tray 12 is placed into the casing while the protection frame 110 is located at the recovery position, FIG. 25 is a perspective view illustrating the handle 122 shown in FIG. 24 closed with respect to the tray body 120, and FIG. 26 is a perspective view illustrating the protection frame 110 shown in FIG. 25 sliding to the protection position. To show the relative relation between the components, parts of the tray body 120 and the second circuit board 16 shown in FIGS. 24 to 26 are cut off. In this embodiment, the handle 122 has a protruding portion 1226, as shown in FIG. 23. Furthermore, as shown in FIG. 20, the protection frame 110 further has an engaging groove 1108 and the second side wall 1100 has a block portion 1110.

As shown in FIG. 24, when the upper power supply 116 has not been placed into the power box 114 yet, the protection frame 110 is located at the recovery position. At this time, the guiding groove 108 is formed between the first side wall 1000 of the support frame 100 and the second side wall 1100 of the protection frame 110, and the protection cover 1101 of the protection frame 110 does not cover the second rack 104 of the support frame 100. Therefore, when the user places the tray 12 into the casing 10, the guiding pillar 1208 of the tray body 120 can enter the guiding groove 108 and the second gear 126 of the tray 12 can contact the second rack 104. Then, the user can rotate the handle 122 with respect to the tray body 120 in the close direction, such that the tray 12 drives the second circuit board 16 to move downwardly. As shown in FIG. 25, when the handle 122 is closed with respect to the tray body 120, the protruding portion 1226 of the handle 122 passes through an opening of the engaging groove 1108 of the protection frame 110. Then, as shown in FIG. 26, the user can place the upper power supply 116 into the power box 114. When the upper power supply 116 is placed into the power box 114, the upper power supply 116 pushes the protection frame 110 to the protection position. At this time, a side wall of the engaging groove 1108 of the protection frame 110 covers the protruding portion 1226 of the handle 122, such that the handle 122 cannot rotate in the open direction. At the same time, the block portion 1110 of the second side wall 1100 also covers the guiding pillar 1208 of the tray body 120, such that the tray 12 cannot move upwardly. Accordingly, when the upper power supply 116 has not been detached from the power box 114 yet, the tray 12 and the second circuit board 16 cannot be removed, so as to prevent the power connector 162 of the second circuit board 16 and/or the plug of the upper power supply 116 from being damaged due to pull and drag.

As mentioned in the above, the invention may dispose the first circuit board in the casing of the electronic device (e.g. server) and dispose the second circuit board on the tray body of the tray. When a user wants to connect the second circuit board with the first circuit board, the user can rotate the handle with respect to the tray body to the predetermined angle in the open direction, such that the resilient portion of the block member is engaged with the engaging portion of the second gear, so as to restrain the handle from rotating with respect to the tray body in the close direction. Afterward, the user can place the tray into the casing, such that the rod member of the support frame moves the resilient portion of the block member, so as to disengage the resilient portion of the block member from the engaging portion of the second gear. When the resilient portion of the block member is disengaged from the engaging portion of the second gear, the first gear contacts the first rack and the second gear contacts the second rack. Then, the user can operate the handle to rotate with respect to the tray body in the close direction, such that the first gear meshes with the first rack and rotates and the first gear drives the second gear to mesh with the second rack and rotate through the linking member. At this time, the tray body moves downwardly in a direction parallel to the first rack and the second rack. When the handle is closed with respect to the tray body, the first connector of the first circuit board and the second connector of the second circuit board are connected to each other, so as to establish data and power transmitting path.

When the user wants to detach the second circuit board from the first circuit board, the user can rotate the handle with respect to the tray body in the open direction, such that the first gear meshes with the first rack and rotates and the first gear drives the second gear to mesh with the second rack and rotate through the linking member. At this time, the tray body moves upwardly in a direction parallel to the first rack and the second rack, such that the first connector of the first circuit board and the second connector of the second circuit board are separated from each other. When the user rotates the handle with respect to the tray body to the predetermined angle in the open direction, the resilient portion of the block member is engaged with the engaging portion of the second gear, so as to restrain the handle from rotating with respect to the tray body in the close direction. At this time, the user can grasp the handle to remove the tray body with the second circuit board thereon from the casing of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:
   a casing comprising a support frame, the support frame having a first rack, a second rack and a rod member; and
   a tray comprising:
      a tray body;
      a handle;
      a first gear fixed on the handle and pivotally connected to the tray body;
      a second gear pivotally connected to the tray body, the second gear having an engaging portion;
      a linking member connected to the first gear and the second gear; and
      a block member fixed on the tray body, the block member having a resilient portion;
   wherein when the handle rotates with respect to the tray body to a predetermined angle in an open direction, the resilient portion is engaged with the engaging portion, so as to restrain the handle from rotating with respect to the tray body in a close direction, the close direction is opposite to the open direction; when the handle is located at the predetermined angle with respect to the tray body and the tray is placed into the casing, the rod member moves the resilient portion, such that the resilient portion is disengaged from the engaging portion; when the resilient portion is disengaged from the engaging portion, the first gear contacts the first rack, the second gear contacts the second rack, and the handle is capable of being operated to rotate with respect to the tray body in the close direction.

2. The electronic device of claim 1, further comprising:
   a first circuit board disposed in the casing, the first circuit board having a first connector; and
   a second circuit board disposed on the tray body, the second circuit board having a second connector;
   wherein when the handle rotates with respect to the tray body to the predetermined angle, the first connector and the second connector are separated from each other; when the handle rotates with respect to the tray body and the handle is closed with respect to the tray body, the first connector and the second connector are connected to each other.

3. The electronic device of claim 1, wherein the tray body has a block portion; when the handle rotates with respect to the tray body to the predetermined angle in the open direction, the block portion restrains the handle from continuing to rotate with respect to the tray body in the open direction.

4. The electronic device of claim 1, wherein the block member further has a press portion, the press portion extends from the resilient portion; when the resilient portion is engaged with the engaging portion and the press portion is pressed, the press portion drives the resilient portion to come off the engaging portion.

5. The electronic device of claim 1, wherein the first gear and the second gear have identical number of teeth and modules; when the handle rotates with respect to the tray body in the close direction, the first gear meshes with the first rack and rotates and the first gear drives the second gear to mesh with the second rack and rotate through the linking member, such that the tray body moves in a direction parallel to the first rack and the second rack.

6. The electronic device of claim 1, wherein the linking member is a linking bar or a reversing gear set.

7. The electronic device of claim 1, wherein the support frame further has a guiding groove, the tray body further has a guiding pillar; when the tray is placed into the casing, the guiding pillar enters the guiding groove.

8. The electronic device of claim 7, wherein the guiding groove has two end inclines, the two end inclines are opposite to each other; when the guiding pillar passes through the two end inclines, the first gear contacts the first rack and the second gear contacts the second rack.

9. The electronic device of claim 8, wherein the guiding groove has a bottom incline, the bottom incline is located between the two end inclines.

10. The electronic device of claim 1, wherein the predetermined angle is 90 degrees.

11. The electronic device of claim 1, further comprising a protection frame, a sliding groove being formed between the support frame and a side wall of the casing, the protection frame being disposed in the sliding groove and capable of sliding between a recovery position and a protection position, the support frame further having a first side wall, the protection frame having a second side wall and a protection cover, wherein when the protection frame is located at the recovery position, a guiding groove is formed between the first side wall and the second side wall; when the protection frame is located at the protection position, the first side wall and the second side wall abut against each other, the guiding groove disappears, and the protection cover covers the second rack.

12. The electronic device of claim 11, wherein the handle has a protruding portion, the protection frame further has an engaging groove; when the protection frame is located at the recovery position, the tray is placed into the casing and the handle rotates with respect to the tray body, the protruding portion passes through an opening of the engaging groove; when the handle is closed with respect to the tray body and the protection frame is located at the protection position, a side wall of the engaging groove covers the protruding portion.

13. The electronic device of claim 11, wherein the tray body further has a guiding pillar; when the protection frame is located at the recovery position and the tray is placed into the casing, the guiding pillar enters the guiding groove.

14. The electronic device of claim 13, wherein the second side wall has a block portion; when the tray is placed into the casing, the handle is closed with respect to the tray body and the protection frame is located at the protection position, the block portion covers the guiding pillar.

15. The electronic device of claim 11, wherein the support frame further has a protruding platform, the protruding platform has a first block surface and a second block surface, the protection frame further has a recess, the recess has a third block surface and a fourth block surface, the protruding platform is located in the recess, the first block surface is opposite to the third block surface, the second block surface is opposite to the fourth block surface; when the protection frame is located at the recovery position, the first block surface retains the third block surface, so as to restrain the protection frame from continuing to slide; when the protection frame is located at the protection position, the second block surface retains the fourth block surface, so as to restrain the protection frame from continuing to slide.

16. The electronic device of claim 11, further comprising a resilient member and a power box, the power box being disposed in the casing, opposite ends of the resilient member being connected to the protection frame and the power box.

17. A tray comprising:
a tray body;
a handle;
a first gear fixed on the handle and pivotally connected to the tray body;
a second gear pivotally connected to the tray body, the second gear having an engaging portion;
a linking member connected to the first gear and the second gear, the first gear driving the second gear to rotate through the linking member; and
a block member fixed on the tray body, the block member having a resilient portion;
wherein when the handle rotates with respect to the tray body to a predetermined angle in an open direction, the resilient portion is engaged with the engaging portion, so as to restrain the handle from rotating with respect to the tray body in a close direction, the close direction is opposite to the open direction; when the resilient portion is disengaged from the engaging portion, the handle is capable of being operated to rotate with respect to the tray body in the close direction.

18. The tray of claim 17, wherein the tray body has a block portion; when the handle rotates with respect to the tray body to the predetermined angle in the open direction, the block portion restrains the handle from continuing to rotate with respect to the tray body in the open direction.

19. The tray of claim 17, wherein the block member further has a press portion, the press portion extends from the resilient portion; when the resilient portion is engaged with the engaging portion and the press portion is pressed, the press portion drives the resilient portion to come off the engaging portion.

20. The tray of claim 18, wherein the linking member is a linking bar or a reversing gear set.

* * * * *